(12) United States Patent
Matsui et al.

(10) Patent No.: US 10,903,847 B2
(45) Date of Patent: Jan. 26, 2021

(54) ANALOG-TO-DIGITAL CONVERSION CIRCUIT AND SIGNAL CONVERSION METHOD THEREOF

(71) Applicant: RENESAS ELECTRONICS CORPORATION, Tokyo (JP)

(72) Inventors: Tetsuo Matsui, Tokyo (JP); Keisaku Sento, Tokyo (JP); Tomohiko Ebata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/717,070

(22) Filed: Dec. 17, 2019

(65) Prior Publication Data
US 2020/0212925 A1 Jul. 2, 2020

(30) Foreign Application Priority Data
Dec. 27, 2018 (JP) ................. 2018-244120

(51) Int. Cl.
*H03M 1/12* (2006.01)
*H03M 1/46* (2006.01)

(52) U.S. Cl.
CPC ........... *H03M 1/468* (2013.01); *H03M 1/124* (2013.01)

(58) Field of Classification Search
CPC ........ H03M 1/462; H03M 1/46; H03M 1/468; H03M 1/145; H03M 1/1215; H03M 1/466; H03M 1/1019; H03M 1/1028; H03M 1/12; H03M 1/1245; H03M 1/804; H03M 1/38; H03M 1/069; H03M 1/1004; H03M 1/1061; H03M 1/124; H03M 1/00

USPC .................................................. 341/155, 172
See application file for complete search history.

(56) References Cited

U.S. PATENT DOCUMENTS

| | | | |
|---|---|---|---|
| 5,248,974 A | 9/1993 | Fattaruso et al. | |
| 8,902,093 B1* | 12/2014 | Leuciuc ............. | H03M 1/1245 341/122 |
| 9,559,716 B1* | 1/2017 | Matsui ................ | H03M 1/46 |
| 2009/0073018 A1* | 3/2009 | Mitikiri ............. | H03M 1/145 341/156 |
| 2011/0234433 A1* | 9/2011 | Aruga ................ | H03M 1/06 341/172 |

(Continued)

*Primary Examiner* — Linh V Nguyen
(74) *Attorney, Agent, or Firm* — McDermott Will N Emery LLP

(57) ABSTRACT

A conventional analog-to-digital conversion circuit has a problem that conversion errors cannot be suppressed. According to one embodiment, the analog-to-digital conversion circuit includes a first digital-to-analog conversion circuit 30 of a capacitance distribution type, a second digital-to-analog conversion circuit 31 of a capacitance distribution type, and a comparison circuit 32 for comparing output voltages of the two digital-to-analog conversion circuits, and before performing a successive comparison operation for successively changing a reference voltage applied to the first digital-to-analog conversion circuit, generates an intermediate digital value having a digital value corresponding to a voltage value of an analog input signal, determines a reference voltage to be applied to the second digital-to-analog conversion circuit 31 in accordance with the intermediate digital value, and thereafter performs a successive comparison operation using the first digital-to-analog conversion circuit 30 in a state in which the state of the second digital-to-analog conversion circuit 31 is held.

13 Claims, 15 Drawing Sheets

(56) References Cited

U.S. PATENT DOCUMENTS

| | | | |
|---|---|---|---|
| 2012/0212362 A1* | 8/2012 | Ebata | H03M 1/1076 |
| | | | 341/155 |
| 2014/0070976 A1* | 3/2014 | Hurrell | H03M 1/1245 |
| | | | 341/172 |
| 2015/0180498 A1* | 6/2015 | Yang | H03M 1/1057 |
| | | | 341/120 |
| 2016/0329904 A1* | 11/2016 | Duryea | H03M 1/1076 |
| 2017/0250702 A1* | 8/2017 | Venca | H03M 1/466 |
| 2018/0183457 A1* | 6/2018 | Lee | H03M 1/0863 |
| 2019/0222220 A1* | 7/2019 | Ryu | H03M 1/1215 |

* cited by examiner

FIG. 5
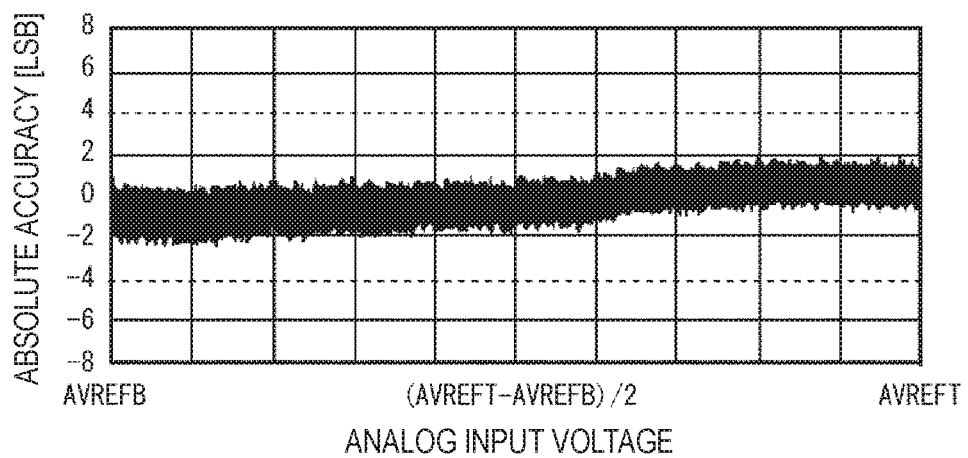
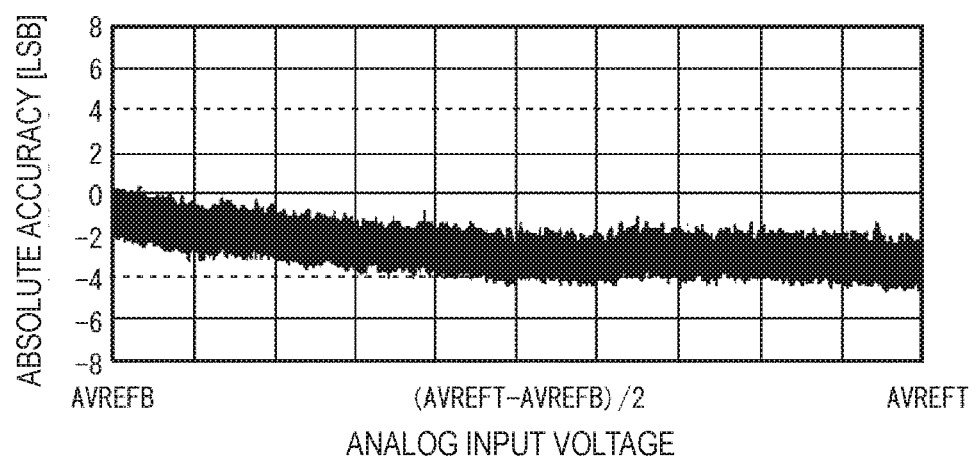
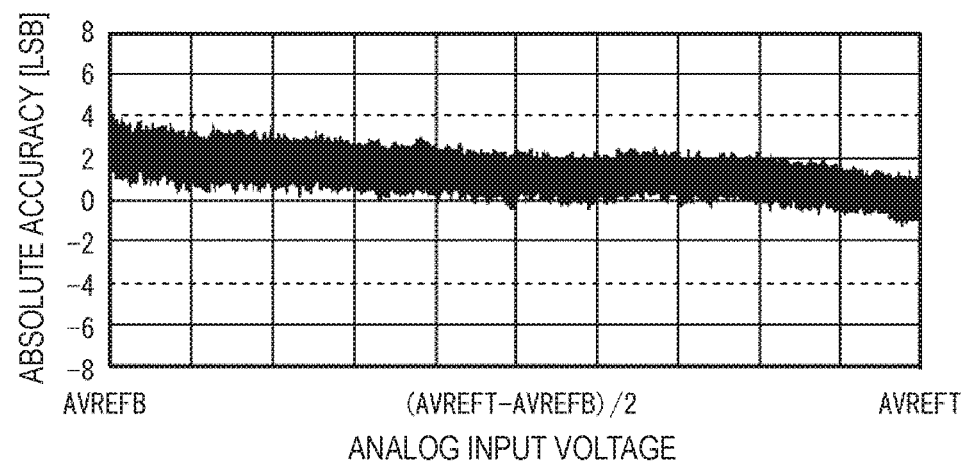

FIG. 6
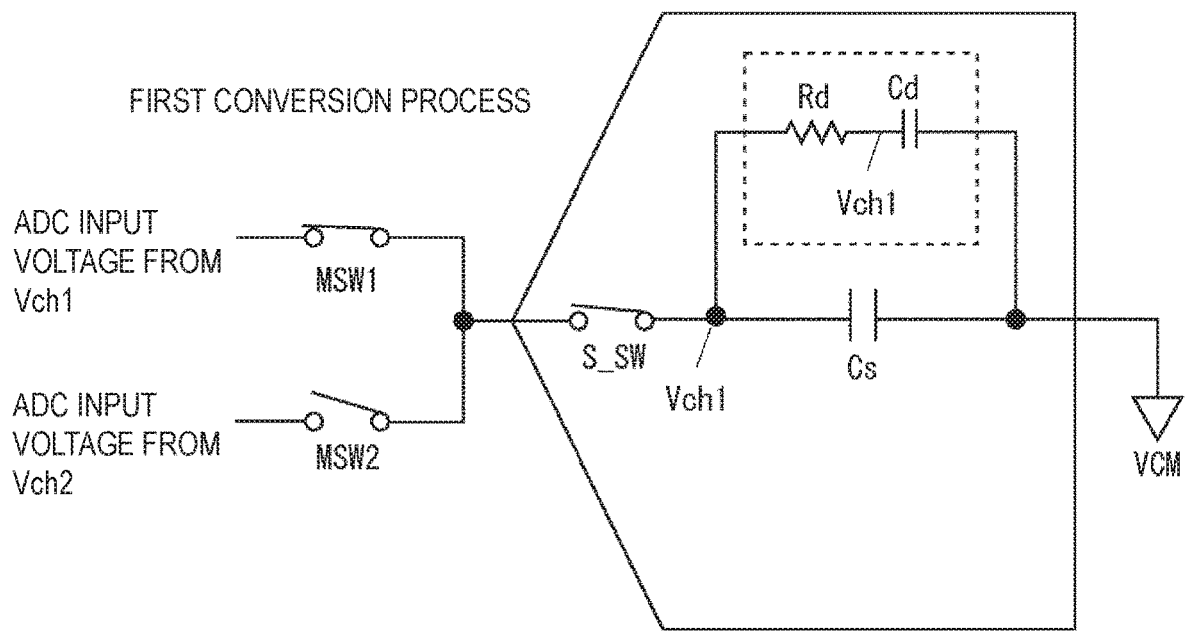
INPUT TO BE SELECTED IS SWITCHED BY A MULTIPLEXER
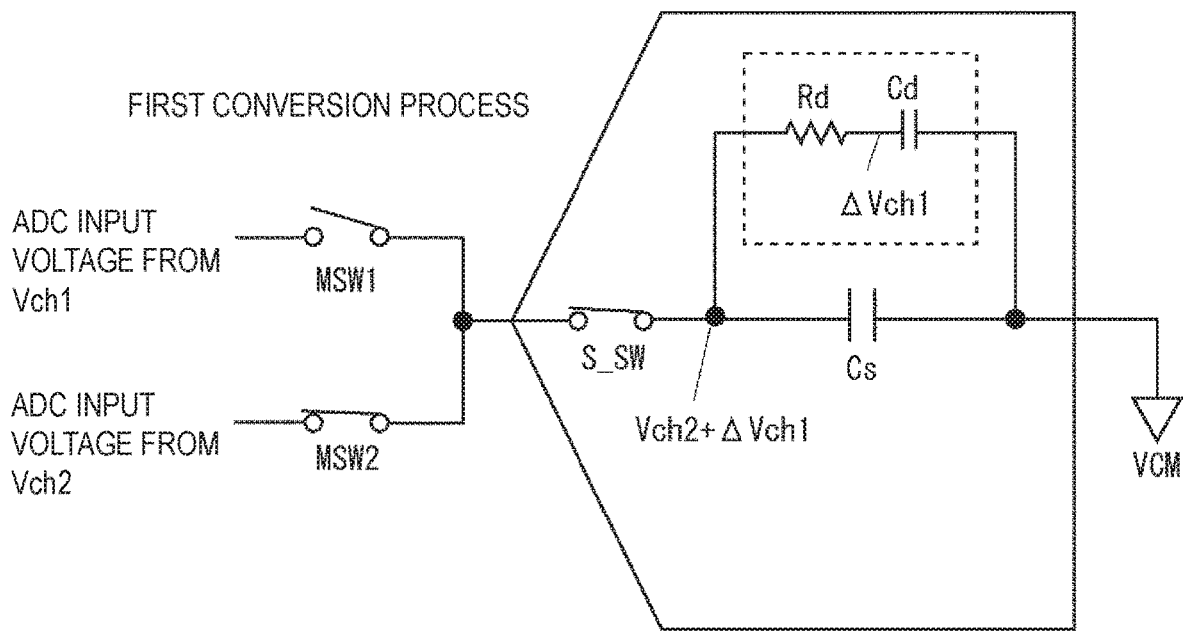

ANALOG-TO-DIGITAL CONVERSION CIRCUIT AND SIGNAL CONVERSION METHOD THEREOF

CROSS-REFERENCE TO RELATED APPLICATIONS

The disclosure of Japanese Patent Application No. 2018-244120 filed on Dec. 27, 2018 including the specification, drawings and abstract is incorporated herein by reference in its entirety.

BACKGROUND

The present invention relates to an analog-to-digital conversion circuit and a signal conversion method thereof, and, for example, to an analog-to-digital conversion circuit for converting an analog input signal into a digital value by a successive comparison operation with respect to a single-ended input, and to a signal conversion method thereof.

When processing information acquired from a sensor using a semiconductor device for performing digital signal processing such as a micro-controller, the information outputted from the sensor has an analog value, and therefore this analog value needs to be converted into a digital value. In such a case, there is an analog-to-digital conversion circuit as a circuit for generating a digital value corresponding to an analog value of an analog signal. There are various types of analog-to-digital conversion circuits, such as a successive comparison type having excellent resolution of conversion processing and a flash type having excellent conversion speed. The successive comparison type of such an analog-to-digital conversion circuit will be described below. An example of this successive comparison type analog-to-digital conversion circuit is disclosed in U.S. Pat. No. 6,774,974.

The analog-to-digital conversion circuit described in U.S. Pat. No. 6,774,974 has two binary-weighted capacitor arrays (NDAC and PDAC). As a result, in the analog-to-digital conversion circuit disclosed in U.S. Pat. No. 6,774,974, the common mode rejection ratio (CMRR) and the power supply rejection ratio (PSRR) are improved by switching the reference voltages to be applied to the two binary load capacitor arrays in the bit array.

SUMMARY

However, when analog-to-digital conversion processing is performed on a plurality of analog input signals in a time division manner while switching the plurality of analog input signals, the input voltage input to the analog-to-digital conversion circuit may vary greatly in accordance with the switching of the selected analog input signal. In such a case, there is a problem that the conversion error becomes large due to the dielectric relaxation phenomenon of the capacitor of the charge distribution type analog-to-digital conversion circuit having the capacitor array.

Other objects and novel features will become apparent from the description of this specification and the accompanying drawings.

According to one embodiment, the analog-to-digital conversion circuit includes a first digital-to-analog conversion circuit of a capacitance distribution type, a second digital-to-analog conversion circuit of a capacitance distribution type, and a comparison circuit for comparing output voltages of the two digital-to-analog conversion circuits, generates an intermediate digital value having a digital value corresponding to a voltage value of an analog input signal before performing a successive comparison operation for successively changing a reference voltage applied to the first digital-to-analog conversion circuit, determines a reference voltage to be applied to the second digital-to-analog conversion circuit according to the intermediate digital value, and then performs a successive comparison operation using the first digital-to-analog conversion circuit in a state where the state of the second digital-to-analog conversion circuit is held.

According to the first embodiment, the conversion error caused by the dielectric relaxation phenomenon in the analog-to-digital conversion circuit can be reduced.

BRIEF DESCRIPTION OF THE DRAWINGS

FIG. 5 is a graph illustrating a conversion error caused by a dielectric relaxation phenomenon.

FIG. 6 is a block diagram illustrating a variation in sampling voltage caused by a dielectric relaxation phenomenon.

DETAILED DESCRIPTION

Figure 1:
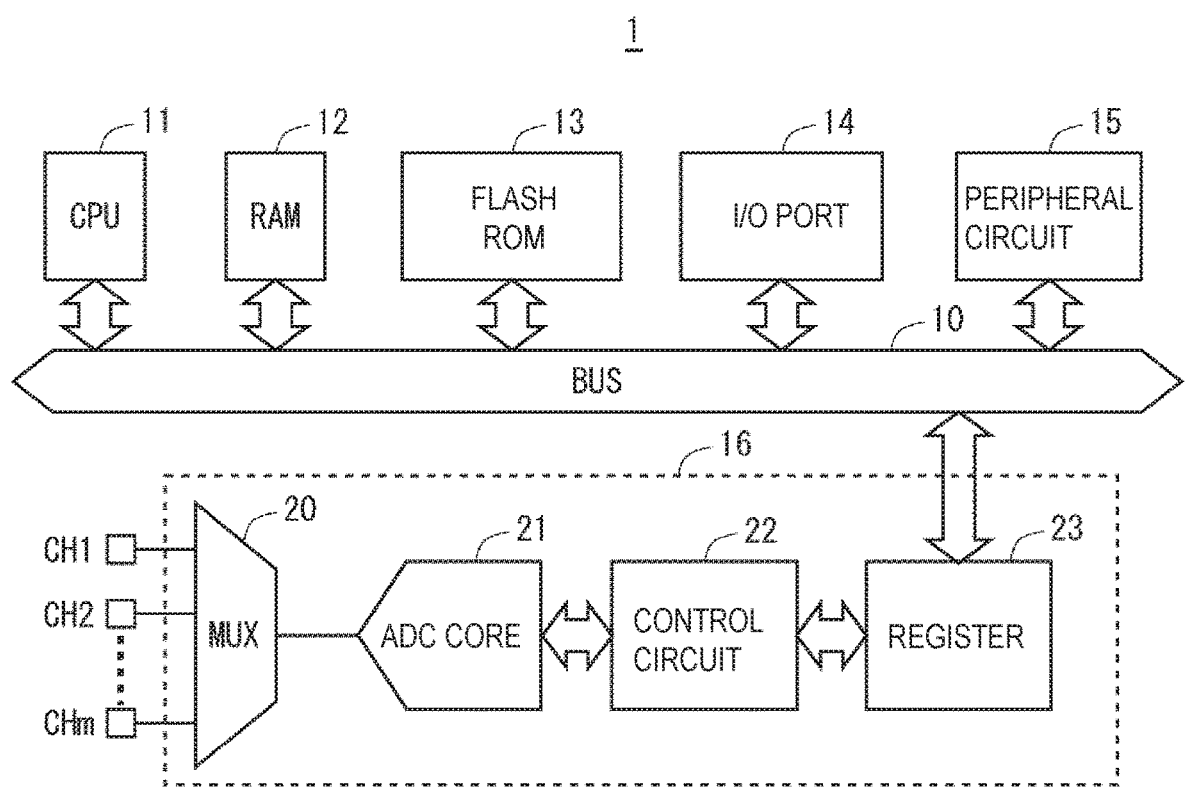
FIG. 1 is a schematic diagram of a semiconductor device including analog-to-digital conversion circuits according to the first embodiment.

For clarity of explanation, the following description and drawings are appropriately omitted and simplified. In addition, the elements described in the drawings as functional blocks for performing various processes can be configured as CPU (Central Processing Unit), memory, and other circuits in terms of hardware, and are realized by a program loaded into the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the program described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, a semiconductor memory (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

The First Embodiment

In the following explanation, an analog-to-digital conversion circuit according to the first embodiment will be described. Although the analog-to-digital conversion circuit may operate as a single unit, examples of the analog-to-digital conversion circuit incorporated in a semiconductor device for performing digital signal processing will be described below. In such a semiconductor device, there may be a plurality of analog inputs to the analog-to-digital conversion circuit. In the analog-to-digital conversion circuit, the influence of the dielectric relaxation phenomenon appears more remarkably when the analog input signal to be subjected to the analog-to-digital conversion processing is switched by time division. In other words, the analog-to-digital conversion circuit according to the first embodiment is more effective in an application in which the analog input signal to be subjected to the analog-to-digital conversion process is switched by time division.

FIG. 1 is a schematic diagram of a semiconductor device including analog-to-digital conversion circuits according to the first embodiment. As shown in FIG. 1, the semiconductor device 1 includes a bus 10, an arithmetic unit (e.g., a CPU11), a RAM12, a flash ROM13, an I/O (Input/Output) port 14, a peripheral circuit 15, and an analog-to-digital conversion circuit 16. In the semiconductor device 1 according to the first embodiment, a CPU11, a RAM12, a flash ROM13, an I/O port 14, a peripheral circuit 15, and an analog-to-digital conversion circuit 16 are interconnected by buses 10.

The CPU11 loads a program stored in a non-volatile memory such as a flash ROM13, and performs a digital signal process according to the content of the loaded program. The RAM12 stores intermediate data generated in the CPU11 process. The flash ROM13 is a nonvolatile memory, and stores programs or setting values for operating the semiconductor device 1. The I/O port 14 is input/output interfaces for data to be transmitted and received between the semiconductor device 1 and another semiconductor device. The peripheral circuit 15 is a circuit group having a specific function used by a CPU11 such as a timer and a floating-point arithmetic processor. The analog-to-digital conversion circuit 16 performs an analog-to-digital conversion process on an analog input signal supplied from the outside, and generates a digital value corresponding to the voltage level of the analog input signal. Since the semiconductor device 1 according to the first embodiment has one of the features of the analog-to-digital conversion circuit 16, the analog-to-digital conversion circuit 16 will be described in more detail below.

As shown in FIG. 1, the analog-to-digital conversion circuit 16 includes a selection circuit, for example, a multiplexer 20, an ADC core 21, a successive comparison ADC control circuit 22, and a register 23. The ADC core 21 selects one of a plurality of analog input signals input via input channels CH1 to CHm, where m is an integer representing the number of channels, and outputs the selected analog input signal to the ADC core 21. At this time, the multiplexer 20 may have, for example, a function of switching an analog input signal to be periodically selected.

The ADC core 21 is a circuit for performing an analog-to-digital conversion process for converting an analog input signal selected by the multiplexer 20 into a digital value. The ADC core 21 is a successive comparison type analog-to-digital conversion circuit. The successive comparison ADC control circuit 22 controls the successive comparison operation of the ADC core 21 for sequentially switching the switches in the ADC core 21 in accordance with the output value of the ADC core 21. The register 23 stores the final result output value Dadc determined by the successive comparison ADC control circuit 22, and outputs the final result output value Dadc in response to a request for CPU11 or the like.

Figure 2:
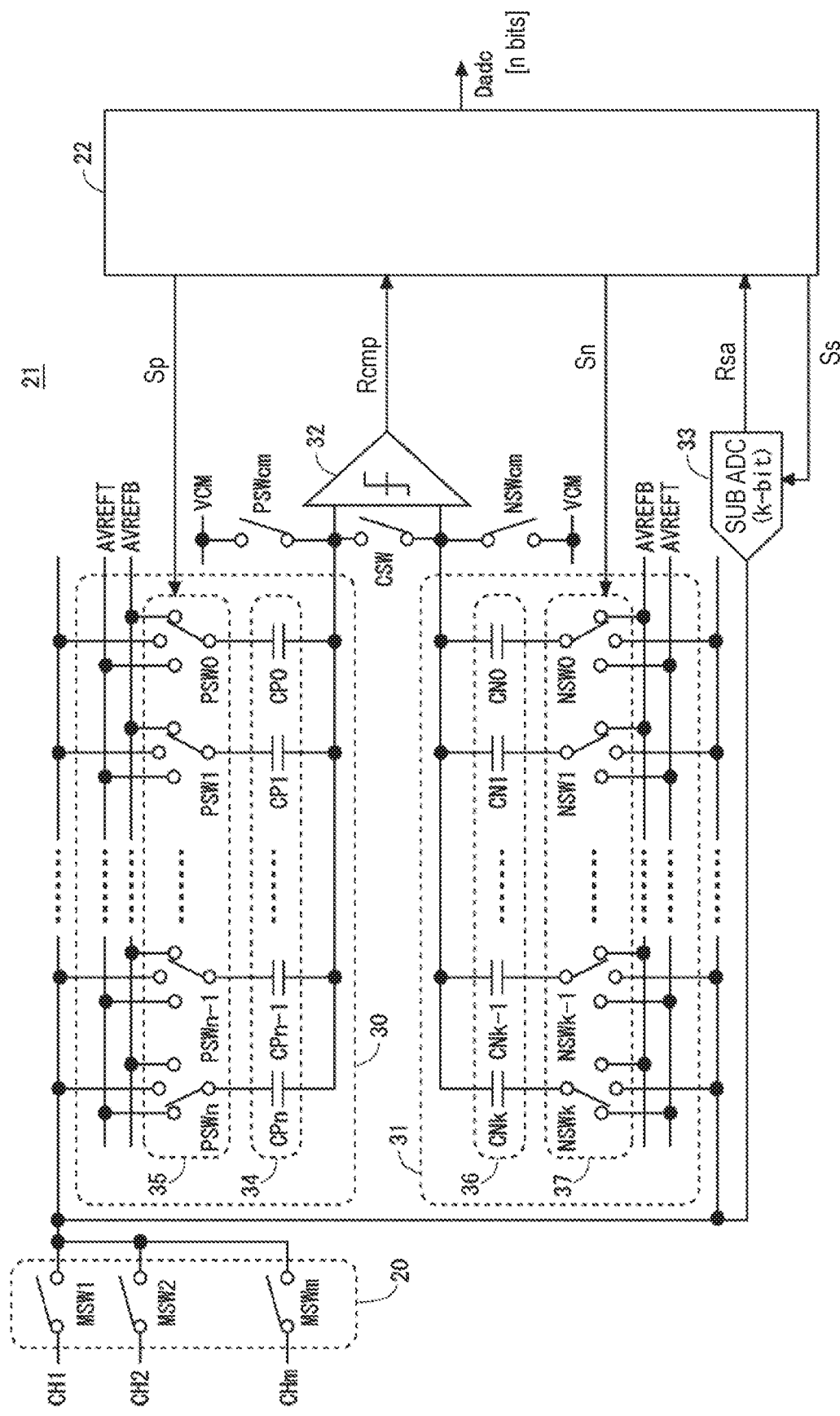
FIG. 2 is a circuit diagram of an analog-to-digital conversion circuit according to the first embodiment.

Semiconductor device 1 for first embodiment has one of the characteristics of the structure of ADC core 21 in particular. Therefore, the ADC core 21 will be described in more detail. FIG. 2 shows a circuit diagram of an analog-to-digital conversion circuit according to the first embodiment. In FIG. 2, the multiplexer 20 and the successive comparison ADC control circuit 22 are also illustrated in order to show the relationship among the ADC core 21, the multiplexer 20, and the successive comparison ADC control circuit 22.

FIG. 2 is a circuit diagram of an analog-to-digital conversion circuit according to the first embodiment.

As shown in FIG. 2, the ADC core 21 includes a first digital-to-analog conversion circuit (e.g., PDAC30), a second digital-to-analog conversion circuit (e.g., NDAC31), a comparison circuit 32, and a sub ADC33. Both PDAC30 and NDAC31 are charge redistribution type digital analog circuits. Here, in the ADC core 21, a main analog-to-digital conversion circuit PDAC30, NDAC31 configured by PDAC30, NDAC31 and the comparison circuit 32.

The PDAC30 includes capacitor array 34 and switch group 35. The capacitor array 34 includes a plurality of first capacitors (e.g., capacitors CP0 to CPn, where n is an integral number representing the resolution of the ADC core 21). The capacitor CP0, CP1 has a capacitance of $2^0$ AC when C is a unit capacitance. Capacitors CP2 to CPn have capacitance values in the order of magnitude of $2^1$ C to $2^{n-1}$ C. One ends of the capacitors CP0 to CPn are connected to one of differential inputs of the comparison circuit 32. The other ends of the capacitors CP0 to CPn are connected to a common terminal of a corresponding one of the switches included in the switch group 35.

The switch group 35 has a number of switches corresponding to the number of capacitors included in the PDAC30. More specifically, the switch group 35 includes a plurality of first switches, for example, a switch PSW0~PSWn. Each of the switches PSW0~PSWn has a common terminal and first to third terminals. The common terminal is connected to the other terminal of the corresponding capacitor. The first terminal is supplied with a high side reference voltage AVREFT (e.g., 5V). The second terminal is supplied with the analog input signal selected by the multiplexer 20. The third terminal is supplied with a low side reference voltage AVREFB, e.g., a low side reference voltage 0V.

The NDAC31 includes capacitor array 36 and switch group 37. Capacitor array 36 includes a plurality of second capacitors (e.g., capacitors CN0 through CNk, where k is an integral number representing the resolution of the sub ADC33). The capacitor CN0, CN1 has a capacitance of $2^{n-k}$ Ca when Ca is used as a unit capacitance. Capacitors CN2 to CNk have capacitance values in the order of magnitude of $2^{n-k+1}$ Ca to $2^{n-1}$ Ca. One ends of the capacitors CN0 to CNk are connected to the other of the differential inputs of the comparison circuit 32. The other ends of the capacitors CN0 to CNk are connected to a common terminal of a corresponding one of the switches included in the switch group 37.

The capacitance value of the unit capacitance Ca is set to a value in which the total capacitance of the capacitor array 34 (the sum of the capacitance values of the capacitors CP0 to CPn) matches the total capacitance of the capacitor array 36 (the sum of the capacitance values of the capacitors CN0 to CNn). When the total capacitance of the capacitor array 34 and the total capacitance of the capacitor array 36 are combined, the capacitance values of the unit capacitance Ca and the unit capacitance C are set to the same value. In the ADC core 21 according to the first embodiment, the resolution (k-bit) of the sub ADC33 is set smaller than the resolution (n-bit) of the ADC core 21. In other words, in the ADC core 21 according to the first embodiment, n≥k is satisfied.

The switch group 37 has a number of switches corresponding to the number of capacitors included in the NDAC31. More specifically, the switch group 37 includes a plurality of second switches, for example, a switch NSW0~NSWk. Each of the switches NSW0~NSWk has a common terminal and first to third terminals. The common terminal is connected to the other terminal of the corresponding capacitor. The first terminal is supplied with a high side reference voltage AVREFT (e.g., 5V). The second terminal is supplied with the analog input signal selected by the multiplexer 20. The third terminal is supplied with a low side reference voltage AVREFB, e.g., a low side reference voltage 0V.

The comparison circuit 32 is a differential input comparison circuit. One end of the switch PSWcm is connected to one of the input terminals of the comparison circuit 32. One end of the switch NSWcm is connected to the other input terminal of the comparison circuit 32. A switch CSW is connected between the two input terminals of the comparison circuit 32. The common voltage VCM is applied to the other end of the switch PWScm and the other end of the switch NSWcm. The comparison circuit 32 compares the voltage output from the PDAC30 with the voltage output from the NDAC31, and outputs the comparison result to the successive comparison ADC control circuit 22 as a comparison result voltage Rcmp.

The sub ADC33 digitizes the analog input signals input to the PDAC30 and the NDAC31 with k-bit resolution. Here, the resolution of the sub ADC33 is set to be equal to or less than the n-bit, which is the resolution of the analog-to-digital conversion circuit configured by the PDAC30, NDAC31 and comparison circuit 32. In the embodiment shown in FIG. 2, the sub ADC33 is a flash type analog-to-digital conversion circuit, and the successive comparison ADC control circuit 22 issues an operation starting instruction for the sub ADC33 to perform the conversion process by using the control signal Ss. Since the sub ADC33 is also a portion requiring high speed, it is preferable to use a flash type analog-to-digital conversion circuit as the sub ADC33, but a successive comparison type analog-to-digital conversion circuit can be used as the sub ADC33.

In the analog-to-digital conversion circuit 16 according to the first embodiment, the successive comparison ADC control circuit 22 switches the reference voltages selected by the switches included in the NDAC31 switch group 37 based on the control signal Sn generated by decoding the sub ADC conversion result Rsa of the sub ADC33. In addition, the successive comparison ADC control circuit 22 generates a control signal Sp based on the output comparison result signal Rcmp, and controls a successive comparison operation for switching reference voltages selected by switches included in switch group 35 of the PDAC30 by the control signal Sp. The successive comparison ADC control circuit 22 controls the entire successive comparison operation of the ADC core 21. Details of the operation of the ADC core 21 controlled by the successive comparison ADC control circuit 22 will be described later.

Figure 3:
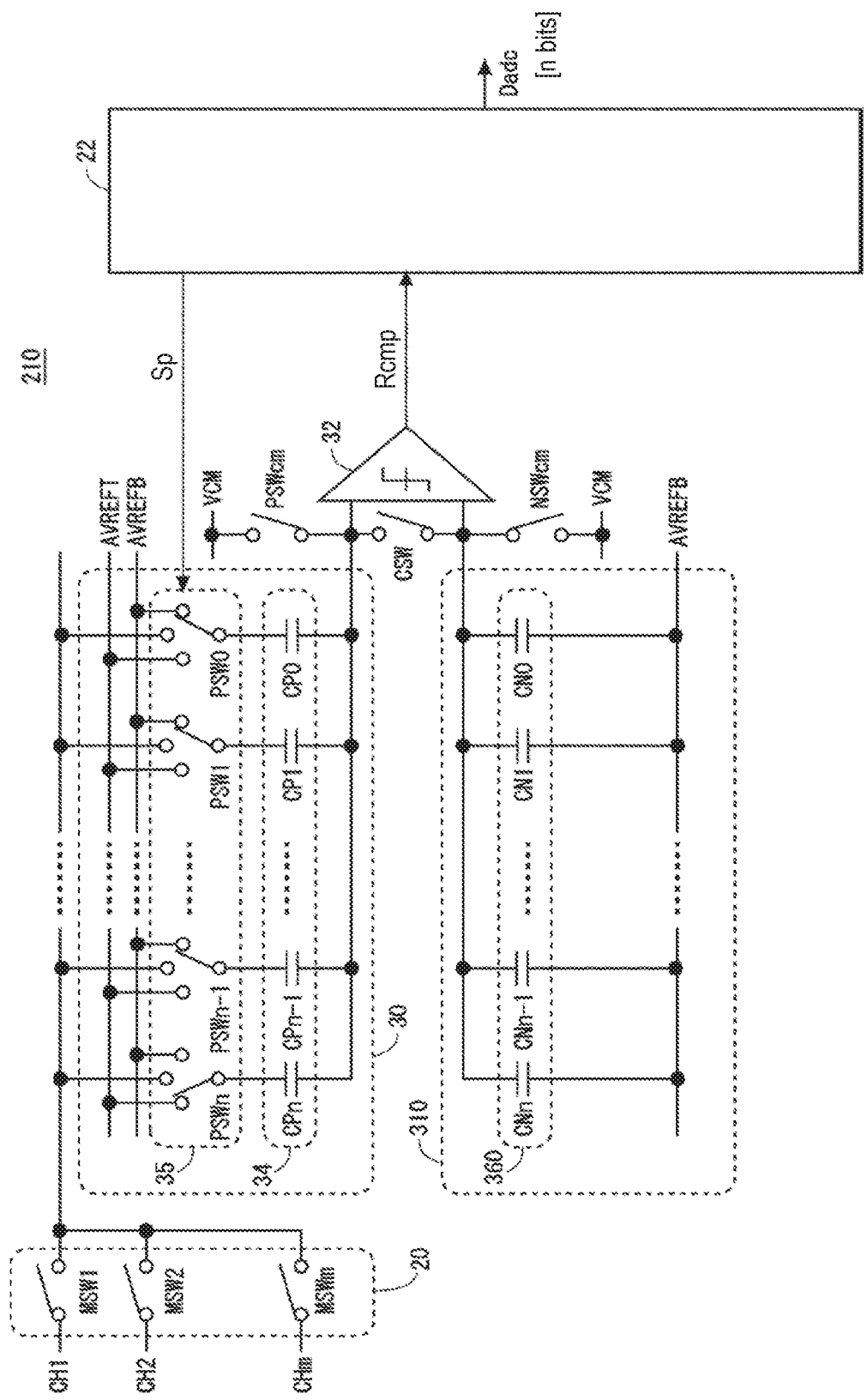
FIG. 3 is a circuit diagram of an analog-to-digital conversion circuit according to a comparative example.

Here, a dielectric relaxation phenomenon which becomes a problem in the analog-to-digital conversion circuit will be described. Therefore, the circuit configuration of the analog-to-digital conversion circuit according to the comparative example used in the description of the dielectric relaxation phenomenon will be described. FIG. 3 is a circuit diagram of the ADC core 210 according to the comparative example.

FIG. 3 is a circuit diagram of an analog-to-digital conversion circuit according to a comparative example. As shown in FIG. 3, in the ADC core 210 according to the comparative embodiment, the NDAC31 and the sub ADC33 of the ADC core 21 described with reference to FIG. 2 are deleted and a NDAC310 is provided. The NDAC310 has a capacitor array 360. The capacitor array 360 includes capacitors CN0 to CNn. The capacitor CN0, CN1 has a capacitance of $2^0$ AC when C is a unit capacitance. Capacitors CN2 to CNn have capacitance values in the order of magnitude of $2^1$ C to $2^{n-1}$ C. One ends of the capacitors CN0 to CNn are connected to the other of the differential inputs of the comparison circuit 32. The other ends of the capacitors CN0 to CNn are supplied with the low potential side reference voltage AVREFB in the examples shown in FIG. 3.

Figure 4A:
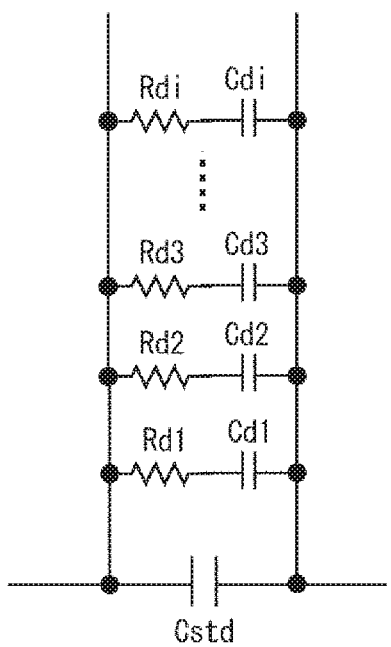
FIG. 4A shows a circuit diagram of an equivalent circuit of a capacitor for explaining the dielectric relaxation phenomenon.
Figure 4B:
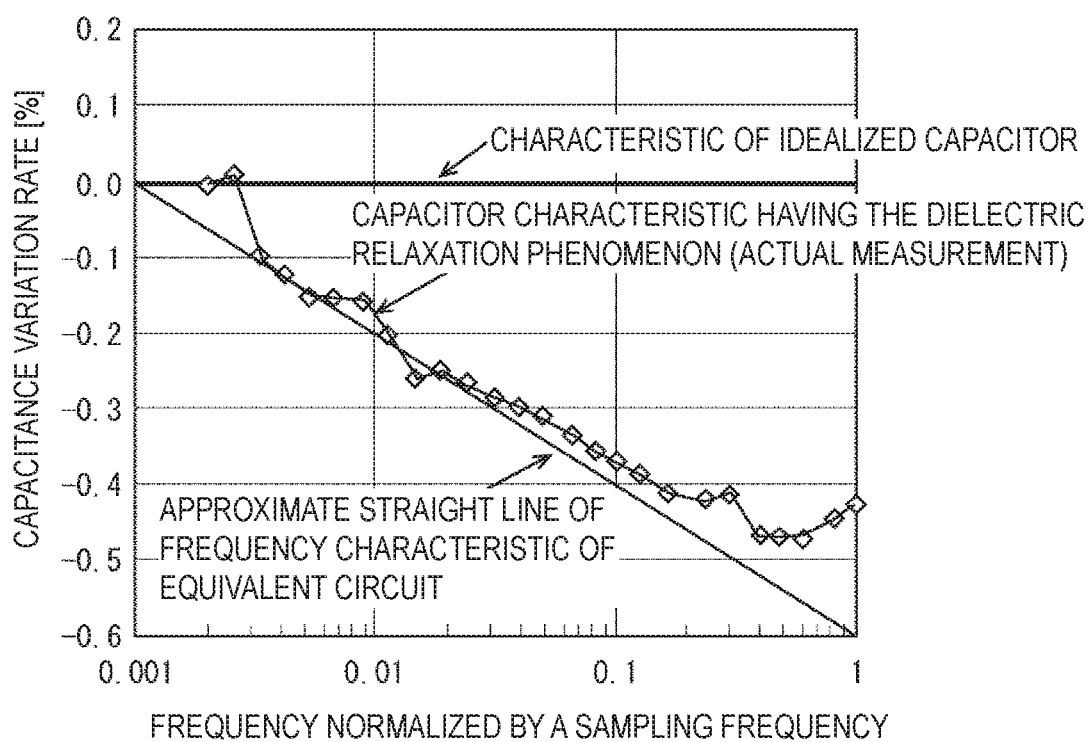
FIG. 4B shows a graph for explaining the frequency characteristics of the capacitor.

FIG. 4A shows a circuit diagram of an equivalent circuit of a capacitor for explaining the dielectric relaxation phenomenon and FIG. 4B shows a graph for explaining the frequency characteristics of the capacitor. The sampling capacitor is formed using a wiring capacitance. Therefore, as shown in FIG. 4A, when a capacitor having ideal characteristics of the sampling capacitor is assumed to be an ideal capacitor Cstd, the sampling capacitor can be represented as an equivalent circuit in which a plurality of series circuits of the parasitic resistor Rd and the parasitic capacitor Cd are connected in parallel to the ideal capacitor Cstd (i in the examples shown in FIG. 4A). That is, a series circuit of a parasitic resistor Rd and a parasitic capacitor Cd which are parasitic to the idealized capacitor Cstd is connected to an actual sampling capacitor. The series circuit of the parasitic resistor Rd and the parasitic capacitor Cd is characterized in that the time constant is slower than the time constant of the ideal capacitor Cstd. In the sampling capacitor, a dielectric relaxation phenomenon occurs due to the series circuit of the parasitic resistor Rd and the parasitic capacitor Cd.

Therefore, the frequency characteristics of the equivalent circuit shown in FIG. 4A are shown in FIG. 4B. FIG. 4B shows the variation value with respect to the capacitance value of 0.002 which is the frequency value obtained by normalizing a frequency characteristic of the sampling capacitor having the parasitic resistor Rd and the parasitic capacitor Cd by the sampling frequency. As shown in FIG. 4B, the capacitance of the idealized capacitor Cstd is constant regardless of the frequency. On the other hand, in the sampling capacitor having the parasitic resistor Rd and the parasitic capacitor Cd, the capacitance value tends to decrease as the normalization frequency increases. The sampling capacitor is also characterized in that it also includes a frequency component that is much slower than the operating frequency of the ADC core 21 that is less than one thousandth of the sampling frequency.

Next, a conversion error caused by the dielectric relaxation phenomenon will be described. The conversion error caused by the dielectric relaxation phenomenon becomes problematic when a plurality of channels are switched to perform analog-to-digital conversion on a plurality of uncorrelated independent analog input signals in a time division manner, for example, the ADC core 21 according to the first embodiment shown in FIG. 2 and the ADC core 210 according to the comparative example shown in FIG. 3.

FIG. 5 is a graph illustrating a conversion error caused by a dielectric relaxation phenomenon. Three graphs are shown in FIG. 5, and all three graphs represent the conversion error when the signal level of the analog input signal input to the ADC core 210 according to the comparative example is swept.

The upper diagram of FIG. 5 shows the conversion error when the analog input signal is not switched by the multiplexer 20. As shown in the upper diagram of FIG. 5, the conversion error is suppressed to about ±2LSB.

The middle part of FIG. 5 shows the conversion error when the conversion process is performed on another analog input signal after the conversion process is performed on the lower limit AVREFB of the amplitudes that the analog input signal can take immediately before. In this case, the conversion error is suppressed to the extent of 2LSB in a portion close to the lower limit voltage AVREFB input immediately before, but the conversion error becomes larger as the voltage of the analog input signal becomes higher.

The lower diagram of FIG. 5 shows the conversion error when the conversion process is performed on another analog input signal after the conversion process is performed on the upper limit voltage AVREFT of the amplitudes that the analog input signal can take immediately before the conversion process. In this instance, the conversion error is suppressed to the extent of 2LSB in the portion close to the upper limit voltage AVREFT input immediately before, but the conversion error becomes larger as the voltage of the analog input signals becomes lower.

In general, the frequency component of the input signal has a sufficiently low frequency with respect to the conversion frequency of the analog-to-digital conversion circuit, but since the channel to be converted is switched, a difference between the input voltages as shown in the middle and lower diagrams of FIG. 5 occurs between the two conversion processes. The conversion error as shown in the middle and lower diagrams of FIG. 5 is affected by the input analog voltage converted in the preceding conversion cycle. The conversion error caused by the influence of the analog input signal converted in the conversion cycle of the previous cycle is caused by the dielectric relaxation phenomenon. Therefore, this dielectric relaxation phenomenon will be described with reference to a circuit model in which only the sampling capacitor is represented in a simplified manner.

Therefore, FIG. 6 is a block diagram illustrating a variation in sampling voltage caused by a dielectric relaxation phenomenon. FIG. 6 shows a circuit in which a series circuit of a parasitic resistor Rd and a parasitic capacitor Cd causing a dielectric relaxation phenomenon is connected in parallel with a sampling capacitor Cs. FIG. 6 shows a switch MSW1, MSW2 for switching inputs and a switch S_SW for switching between a sample state and a hold state of the analog-to-digital conversion circuit. In the modeling circuit shown in FIG. 6, the switch MSW1, MSW2 is connected in parallel to the switch S_SW.

In FIG. 6, the analog input voltage Vch1 input from the channels CH1 is converted by the first conversion process. At this time, the voltage at the input terminal of the sampling capacitor Cs becomes the analog input voltage Vch1. In the first conversion process, the parasitic capacitance Cd causing the dielectric relaxation phenomenon is charged with a charge corresponding to the analog input voltage Vch1.

Thereafter, the channel to which the analog input voltage to be converted is input is switched from the channel CH1 to the channel CH2. In FIG. 6, the modeling circuit in the analog-to-digital conversion processing for the analog input voltages Vch2 input from the channels CH2 is shown as the second conversion processing. As shown in FIG. 6, in the second conversion process, charges caused by the analog input signal Vch1 of the previous cycle remain in the parasitic capacitor Cd due to the dielectric relaxation phenomenon, an error of ΔVch1 occurs in the voltage on the input terminal side of the sampling capacitor Cs due to the remaining charges, and the voltage on the input terminal side of the sampling capacitor Cs becomes Vch2+ΔVch1 in the second conversion process.

Here, the error voltage ΔVch1 will be described. Assuming that the sampling time is Ts, the error ΔVch1 remaining in the parasitic capacitor Cd can be expressed by Equation (1).

$$\Delta Vch1 = (Vch2 - Vch1)\text{EXP}(-Ts/(Cd \cdot Rd)) \quad (1)$$

(1) From the equation, when the sampling time Ts is sufficiently larger (Ts>>Cd·Rd) than the time constant (Cd·Rd) of the parasitic component, ΔVch1 becomes a negligibly small value. However, as is obvious from the equivalent circuit shown in FIG. 4A, since the sampling capacitor Cs includes a plurality of time constants, the relationship Ts>>Cd·Rd does not hold, and ΔVch1 becomes an error component of a non-negligible magnitude. A part of the error charge ΔVch1 is discharged during the comparison operation of the ADC core 210, and becomes a conversion error.

Figure 7:
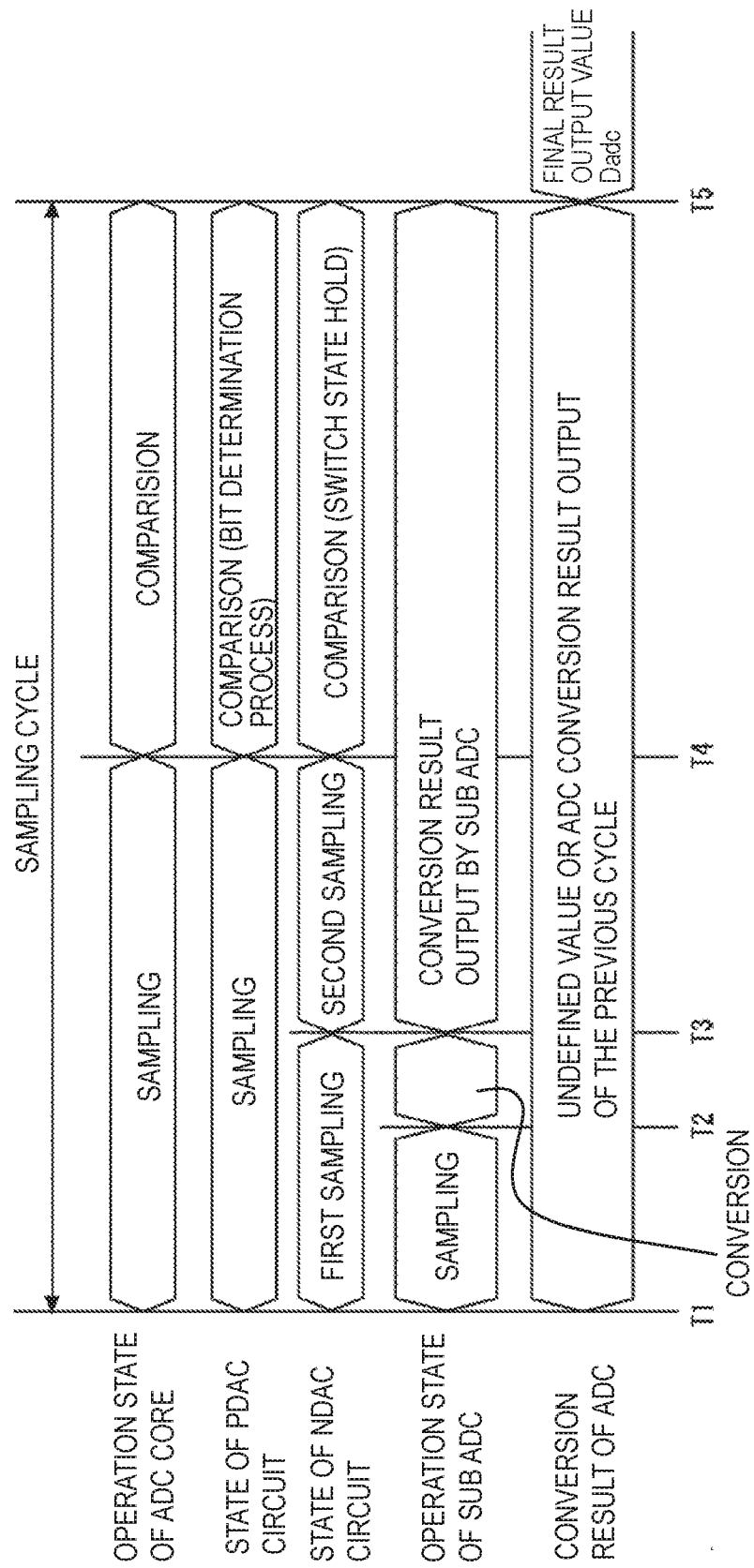
FIG. 7 is a timing chart for explaining the operation of the analog-to-digital conversion according to the first embodiment.

The analog-to-digital conversion circuit 16 according to the first embodiment suppresses the conversion error caused by the dielectric relaxation phenomenon based on the circuit configuration shown in FIG. 2 and the operation corresponding to the circuit configuration. FIG. 7 is a timing chart for explaining the operation of the analog-to-digital conversion circuit 16 according to the first embodiment.

FIG. 7 is a timing chart for explaining the operation of the analog-to-digital conversion circuit according to the first embodiment. As shown in FIG. 7, the analog-to-digital conversion circuit 16 according to the first embodiment outputs a final result output value Dadc which is a digital value converted in the current sampling cycle during the subsequent sampling cycle after the current sampling cycle is completed.

The operation of the analog-to-digital conversion circuit 16 during one sampling cycle will be described with reference to the timing chart shown in FIG. 7. As shown in FIG. 7, the ADC core 21 performs a sampling process during a period of timing T1 to T4, and performs a comparison process of determining a final result output value by a successive comparison operation by operating switches PSW0~PSWn during a period of timing T4 to T5. In the analog-to-digital conversion circuit 16 according to the first embodiment, during the sampling process at the timing T1 to T4, switches PSW0~PSWn in the PDAC30 is caused to select the analog input signal, and the sampling process is performed to apply the analog input signal to the capacitors CP0 to CPn. In the analog-to-digital conversion circuit 16 according to the first embodiment, during the comparison processing at timings T4 to T5, the successive comparison ADC control circuit 22 operates the switches PSW0~PSWn on the basis of the comparison result Rcmp to perform the comparison processing for determining the reference voltage to be applied to the capacitors CP0 to CPn to either the high potential side reference voltage AVREFT or the low potential side reference voltage AVREFB.

The analog-to-digital conversion circuit 16 according to the first embodiment is characterized in that the analog-to-digital conversion circuit 16 performs a process using a sub ADC33 and a NDAC31 during timings T1 to T4. As shown in FIG. 7, the analog-to-digital conversion circuit 16 according to the first embodiment performs a first sampling process for sampling analog input signals NDAC31 during the first periods of the timings T1 to T3. In the period of timings T1 to T2 in the first period, the sub ADC33 samples the input analog signal. Subsequently, during the period from the timings T2 to T3 in the first period, the sub ADC33 performs analog-to-digital conversions on the analog input signals sampled at the timings T1 to T2.

At timing T3, the sub ADC conversion result Rsa outputted by the sub ADC33 is determined. Thereafter, in the second period from the timings T3 to T4, the analog-to-digital conversion circuit 16 according to the first embodiment outputs the control signal Sn to the successive comparison ADC control circuit 22, operates the switches NSW0~NSWk, and applies one of the high potential side reference voltage AVREFT and the low potential side reference voltage AVREFB to the other ends of the capacitors CN0 to CNk in accordance with the value of the sub ADC conversion result Rsa. As a result, the amount of charge stored in the NDAC31 capacitors CN0 to CNk becomes an amount of charge equivalent to the amount of charge stored to capacitors CP0 to CPn in the PDAC30 when the final result output value Dadc is determined by the ADC core 21.

Then, the analog-to-digital conversion circuit 16 according to the first embodiment performs a bit determination process by a successive comparison operation for performing a switching operation on the PDAC30 while maintaining the NDAC31 state determined before the timing T4 in the third period after the timing T4.

Here, the state of the circuit of the ADC core 21 in the first sampling process (first period), the second sampling process (second period), and the comparison process (third period) will be described. Therefore, the state of the circuit in each period will be described with reference to FIGS. 8 to 10.

Figure 8:
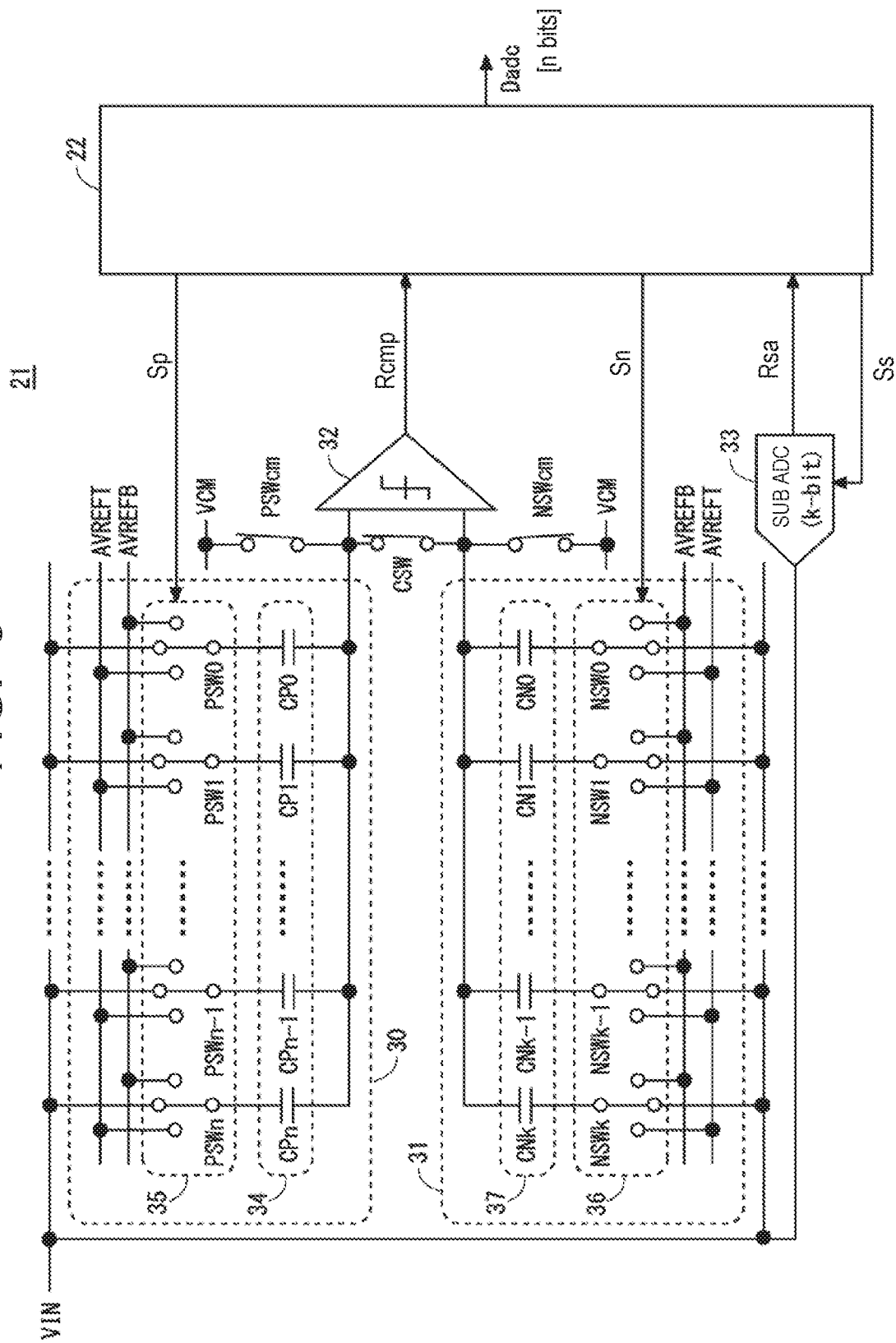
FIG. 8 is a circuit diagram for explaining states of switches in a first sampling process of an analog-to-digital conversion circuit according to the first embodiment.

FIG. 8 is a circuit diagram for explaining states of switches in a first sampling process of an analog-to-digital conversion circuit according to the first embodiment. As shown in FIG. 8, in the first sampling process, the switches PSW0~PSWn and NSW0~NSWk select the second terminals, and capacitors CP0 to CPn in the PDAC30 and capacitors CN0 to CNk in the NDAC31 are supplied with the analog input signal VIN. In the first sampling process, the switches PSWcm, NSWcm and CSW are turned on, and the input terminal of the comparison circuit 32 is set to the common voltage VCM.

Figure 9:
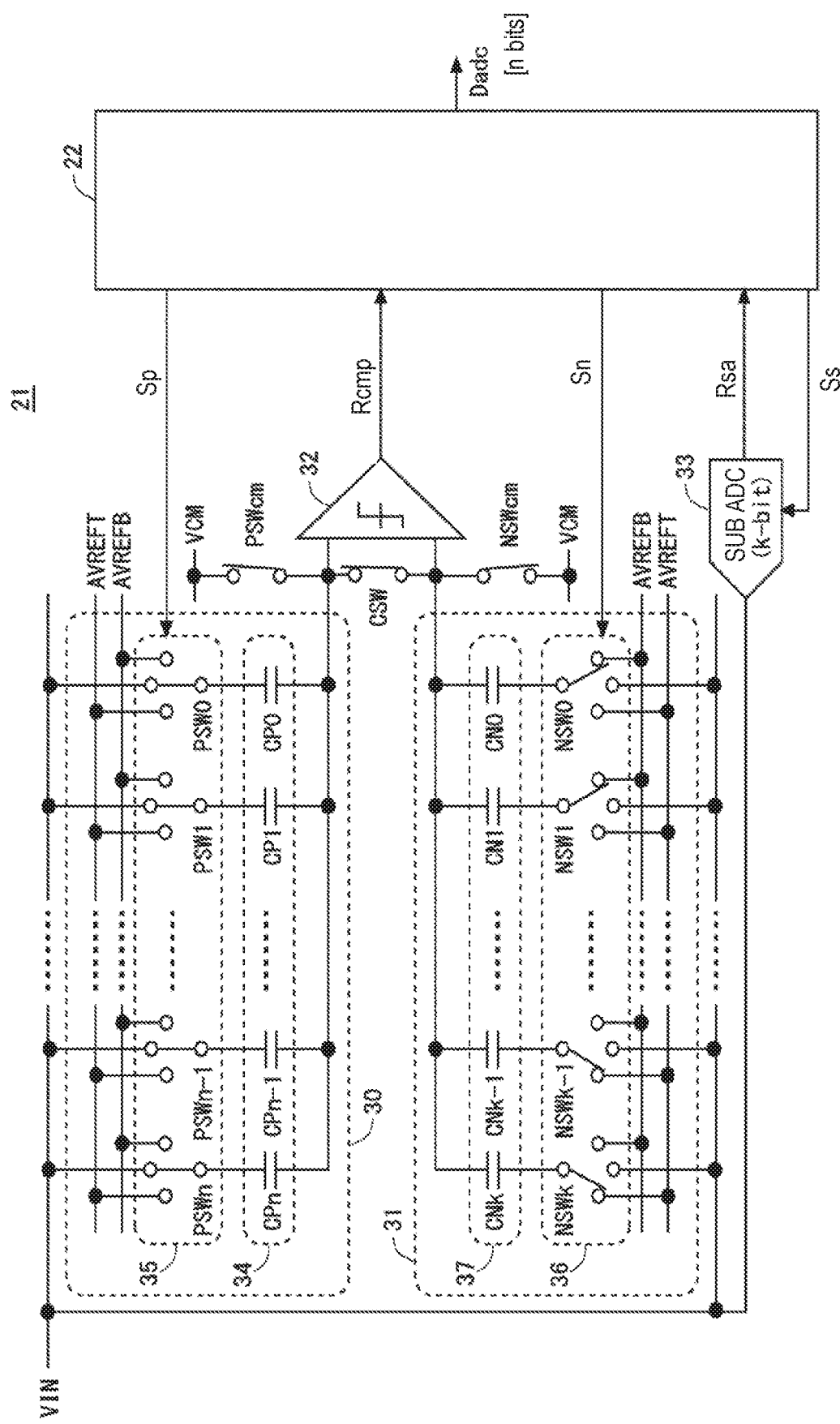
FIG. 9 is a circuit diagram illustrating states of switches in a second sampling process of the analog-to-digital conversion circuit according to the first embodiment.

FIG. 9 is a circuit diagram illustrating states of switches in a second sampling process of the analog-to-digital conversion circuit according to the first embodiment. As shown in FIG. 9, in the second sampling process, the switches PSW0~PSWn select the second terminal, and the analog input signal VIN is supplied to the PDAC30 capacitors CP0 to CPn. On the other hand, in the second sampling process, the switches NSW0~NSWk are supplied with the high potential side reference voltage AVREFT or the low potential side reference voltage AVREFB at the other end of the capacitors CN0 to CNk based on the sub ADC conversion result Rsa outputted by the sub ADC33. In the second sampling process, the switches PSWcm, NSWcm and CSW are turned on, and the input terminal of the comparison circuit 32 is set to the common voltage VCM. As a result, the amount of charge accumulated in the capacitors CN0 to CNk of the NDAC31 becomes the amount of charge corresponding to the voltage levels of the analog input signals.

Figure 10:
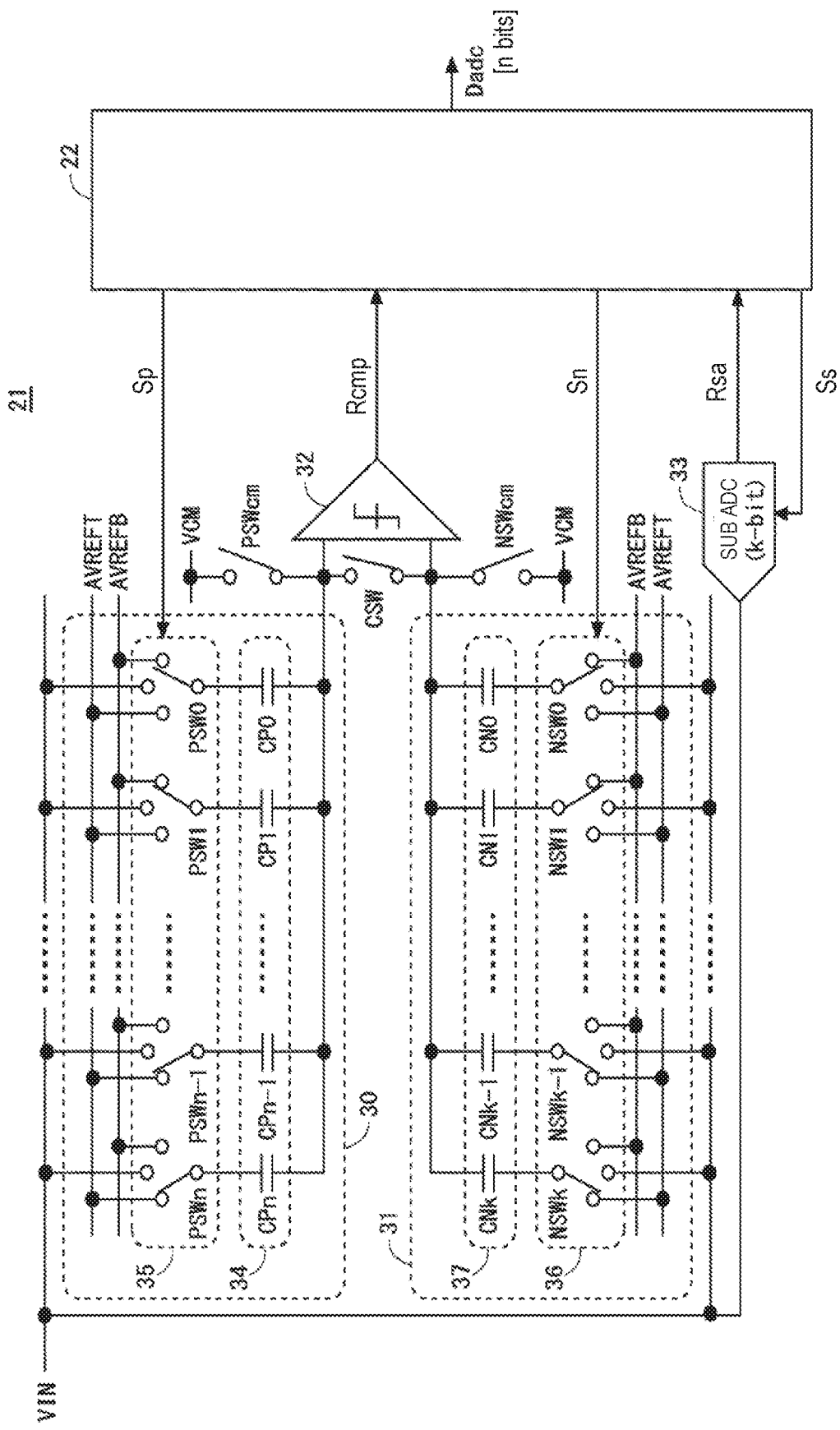
FIG. 10 is a circuit diagram for explaining states of switches during a comparison process of an analog-to-digital conversion circuit according to the first embodiment.

FIG. 10 is a circuit diagram for explaining states of switches during a comparison process of an analog-to-digital conversion circuit according to the first embodiment. As shown in FIG. 10, in the comparison process, the state of the switches NSW0~NSWk are maintained in the state at the completion of the second sampling process. On the other hand, in the comparison process, the switches PSW0~PSWn are sequentially switched from the switch PSW0 based on the comparison result Rcmp, and the high potential side reference voltage AVREFT or the low potential side reference voltage AVREFB is applied to the other ends of the capacitors CP0 to CPn. In the comparison process, the switches PSWcm, NSWcm and CSW are turned off, and the common voltage VCM is stopped from being supplied to the input terminal of the comparison circuit 32.

Based on the above circuit configuration and operation, the analog-to-digital conversion circuit 16 according to the first embodiment suppresses the conversion error caused by the dielectric relaxation phenomenon, and the suppressing effects will be described in more detail.

First, in the first sampling process, the PDAC30 and the NDAC31 are connected to sample the analog input signal VIN. At this time, the common voltage VCM is applied to the input terminal of the comparison circuit 32. That is, at the time of the first sampling process, the same charges are accumulated in the capacitors constituting the capacitor arrays in the PDAC30 and the NDAC31. In the first sampling process, the sub ADC33 also samples the analog input signal VIN. Then, at the end of the first sampling process, the conversion start signal of the sub ADC33 is issued by the control signal Sa, and the sub ADC33 quantizes the analog input signal VIN to k-bit. Then, the k-bit sub ADC conversion result Rsa is decoded by the successive comparison ADC control circuit 22. Thereafter, the process shifts to the second sampling process, and the successive comparison ADC control circuit 22 generates a control signal Sn of the NDAC31. The control signal Sn is generated so that the quantity of charges of the NDAC31 approaches the relation of the equation (2). (VIN−VCM) $2^n$C≈(AVREFT−VCM)·$(2^k-m)·2^{n-k}$·Ca+(AVREFB−VCM)·m·2n-k·Ca . . . (2) where C is the minimum unit capacity of the LSB (Least Significant Bit) on the PDAC30 side, and Ca is the minimum unit capacity of the LSB (Least Significant Bit) on the NDAC31 side. m is the number of capacitances for selecting the low side reference voltage AVREFB derived from the sub ADC conversion result Rsa of the sub ADC33, and can be expressed as positive integers of 0 to $2^k$.

Thereafter, in the analog-to-digital conversion circuit 16 according to the first embodiment, the NDAC31 is fixed as it is after the second sampling process is completed in the comparison process, and the PDAC30 is subjected to the successive comparison control, thereby obtaining the final result output value Dadc.

Description will be made as to whether the influence of the dielectric relaxation phenomenon of the capacitor capacitance is reduced in the above operation. First, if the error component remaining in the parasitic component of dielectric relaxation in the capacitor of the PDAC30 is represented by ΔVch1_P, the error component ΔVch1_P is expressed by Equation (3). ΔVch1_P=(Vch2−Vch1)EXP(−Ts/(Cdp·Rdp)) (3) where Ts is the sampling time obtained by adding the time required for the first sampling process and the time required for the second sampling process, and Cdp and Rdp are parasitic components that cause the dielectric relaxation phenomenon of capacitors in the PDAC30. (3) Based on Equation (4), the error charges ΔQ_PDAC accumulated in the PDAC30 can be expressed by Equation (4).

$$\Delta Q\_PDAC=(Vch2-Vch1)EXP(-Ts/(Cdp \cdot Rdp)) \cdot 2^n C \quad (4)$$

Next, error components caused by dielectric relaxation phenomenon in the NDAC31 will be considered. Let Ts1 be the sampling time required for the first sampling process and Ts2 be the time required for the second sampling process. That is, Ts=Ts1+Ts2. As a result, the error components ΔVch1_1_N generated in the NDAC31 in the first sampling process can be expressed by Equation (5). Note that Cdn and Rdn are generated components contributing to dielectric relaxation of capacitors in the NDAC31.

$$\Delta Vch1\_1\_N=(Vch2-Vch1)EXP(-Ts1/(Cdn \cdot Rdn)) \quad (5)$$

Next, the error after the transition to the second sampling process will be considered. During the second sampling process, the reference voltage applied to the other ends of the capacitors CN0 to CNk is divided into a low potential side reference voltage AVREFB and a high potential side reference voltage AVREFT in accordance with the sub ADC conversion result Rsa of the sub ADC33.

At this time, the error charge ΔQT of the capacitor to which the high potential side reference voltage AVREFT is applied is represented by Equation (6), and the error charge ΔQB of the capacitor to which the low potential side reference voltage AVREFB is applied is represented by Equation (7). ΔQT=(AVREFT−(Vch2−ΔVch 1_1_N))·EXP(−Ts2/(Cdn·Rdn))·$(2^k-m)·2^{n-k}$·Ca·6)ΔQB=(AVREFB−(Vch2−ΔVch 1_1_N))·EXP(−Ts2/(Cdn·Rdn))·m·$2^{n^{-k}}$·Ca . . . (7) and the error charges of the NDAC31 from the equations (6) and (7) are represented by the equation (8).

$$\Delta Q\_NDAC=\Delta QT+\Delta QB=(AVREFT \cdot (2^k-m) \cdot 2^{n-k} \cdot Ca+ \\ AVREFB \cdot m \cdot 2^{n-k} \cdot Ca)+(\Delta Vch1\_1\_N-Vch2) \cdot 2^n \cdot Ca) \\ *EXP(-Ts2/(Cdn \cdot Rdn)) \quad (8)$$

Here, when the input converted equivalent voltage of the charge quantity generated by the NDAC31 from the sub ADC conversion result Rsa of the sub ADC33 is expressed as Vch2_q, Vch2_q is expressed by Equation (9).

$$Vch2\_q=AVREFT*(2^k-m)+AVREFB \cdot m \quad (9)$$

When the equation (9) is applied to the equation (8), the equation (8) becomes the equation (10).

$$\Delta Q\_NDAC=(\Delta Vch1\_1\_N+Vch2\_q-Vch2) \cdot 2^n Ca/EXP \\ (-Ts2/(Cdn \cdot Rdn))=(Vch2-Vch1)EXP(-Ts/ \\ (Cdn \cdot Rdn)) \cdot 2^n Ca+(Vch2\_q-Vch2)*2^n Ca \cdot EXP(- \\ Ts2/(Cdn \cdot Rdn)) \quad (10)$$

In the ADC core 21 according to the first embodiment, only the differential component among the error components of the ΔQ_PDAC and the ΔQ_NDAC affects the comparison result, and the in-phase component is canceled by the comparison circuit. Therefore, when the differential component ΔQ_diff is obtained based on the equations (4) and (10), the differential component ΔQ_diff is expressed by the equation (11). In the calculations of Equation (11), the unit capacitance Ca of capacitors in the NDAC31 was calculated as the same capacitance as the unit capacitance C of capacitors in the PDAC30.

$$\Delta Q\_diff=\Delta Q\_PDAC-\Delta Q\_NDAC=(Vch2\_q-Vch2) \\ *2nC \cdot EXP(-Ts2/(Cdn \cdot Rdn)) \quad (11)$$

Then, in Equation (11), when Vch 2_q=Vch2, Rdp=Rdn, and Cdp=Cdn, ΔQ_diff≈0 is obtained. In other words, it is understood from the equation (11) that the error due to the dielectric relaxation components is canceled by using the ADC core 21 according to the first embodiment.

However, in the ADC core 21 according to the first embodiment, when the resolution (k-bit) of the sub ADC33 is set smaller than the resolution (n-bit) of the ADC core 21, the residual quantity of ΔQ_diff changes due to this difference in resolution, so that the ADC core 21 according to the first embodiment cannot cancel all the errors due to the dielectric relaxation phenomenon, but can sufficiently attenuate the errors. Therefore, the relationship between the effects of canceling the error caused by the dielectric relaxation phenomenon depending on the difference in the resolution of the sub ADC33 will be described.

Figure 11:
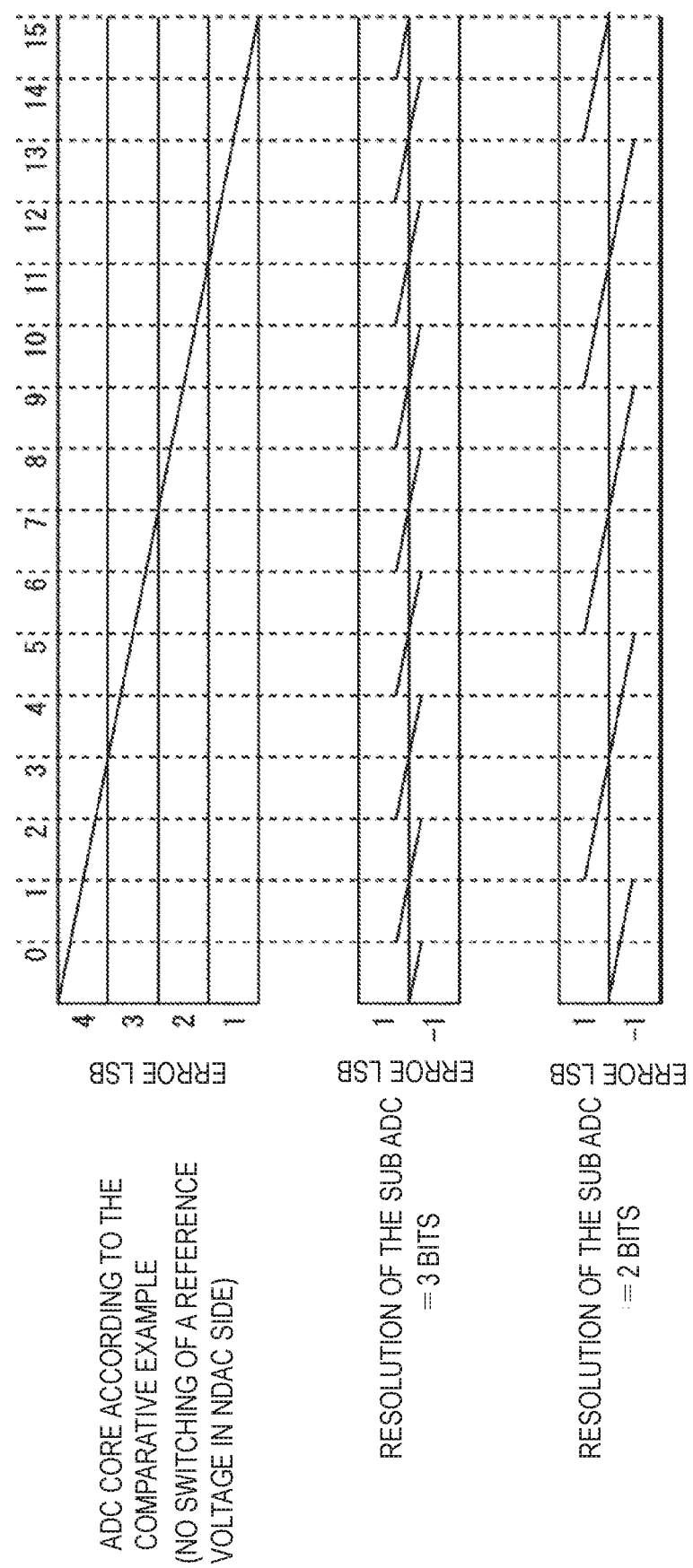
FIG. 11 is a graph illustrating the resolution of sub ADC and the effects of canceling dielectric relaxation phenomenon in analog-to-digital conversion circuits according to the first embodiment.

FIG. 11 is a graph illustrating the resolution of sub ADC and the effects of canceling dielectric relaxation phenomenon in analog-to-digital conversion circuits according to the first embodiment. In FIG. 11, the vertical axis represents the magnitude of the error component, and the horizontal axis represents the number of quantization bits of the ADC core. The upper graph of FIG. 11 shows the error LSB generated in the analog-to-digital conversion circuit when the ADC core 210 according to the comparative example is used. The graphs in the middle part of FIG. 11 show the error LSBs generated in the analog-to-digital conversion circuit when the ADC core 21 according to the first embodiment is used with the resolution of the sub ADC33 being 3 bits. The lower graphs of FIG. 11 show the error LSBs generated in the analog-to-digital conversion circuit when the ADC core 21 according to the first embodiment is used with the resolution of the sub ADC33 being 2 bits.

As shown in FIG. 11, when the ADC core 210 according to the comparative example is used, the error LSB is 4LSB at most. On the other hand, if the resolution of the sub ADC33 is 2 bits or 3 bits, the error LSB is equal to or less than ±1LSB. Further, it is understood that the magnitude of the error LSBs becomes smaller when the resolution of the sub ADC33 is increased.

As described above, the analog-to-digital conversion circuit 16 according to the first embodiment uses the sub ADC33 to adjust the charge amount of the NDAC31 at the time of the comparison process to the charge accumulation amount corresponding to the magnitude of the analog input signal. As a result, in the analog-to-digital conversion circuit 16 according to the first embodiment, it is possible to reduce errors caused by dielectric relaxation of the capacitor in the PDAC30.

In particular, in the analog-to-digital conversion circuit 16 having the multiplexer 20 such that the analog input signal input by the conversion cycle has a discontinuous voltage value, there is a tendency that the conversion error caused by the dielectric relaxation phenomenon becomes large. For this reason, the analog-to-digital conversion circuit 16 according to the first embodiment is more effective in reducing errors when the multiplexer 20 is included in the analog-to-digital conversion circuit 16.

In the analog-to-digital conversion circuit 16 according to the first embodiment, the resolution of the sub ADC33 can be made smaller than the resolution of the ADC core 21. As a result, it is possible to reduce the time required for the conversion process of the sub ADC33 to be performed in the first period in the analog-to-digital conversion circuit 16 according to the first embodiment.

In the analog-to-digital conversion circuit 16 according to the first embodiment, the circuit size required for the sub ADC33 can be suppressed by making the resolution of the sub ADC33 smaller than the resolution of the ADC core 21.

In the analog-to-digital conversion circuit 16 according to the first embodiment, the sum of the capacitance values of the capacitors CP0 to CPn provided in the PDAC30 matches the sum of the capacitance values of the capacitors CN0 to CNk provided in the NDAC31. As a result, the analog-to-digital conversion circuit 16 according to the first embodiment can reduce the conversion error caused by the in-phase components between the signal output by the PDAC30 and the signal output by the NDAC31.

The Second Embodiment

In the second embodiment, the ADC cores 21a and 21b as another form of the ADC core 21 according to the first embodiment will be described. In the description of the second embodiment, the constituent elements described in the first embodiment are denoted by the same reference numerals as those of the first embodiment, and the description thereof is omitted.

Figure 12:
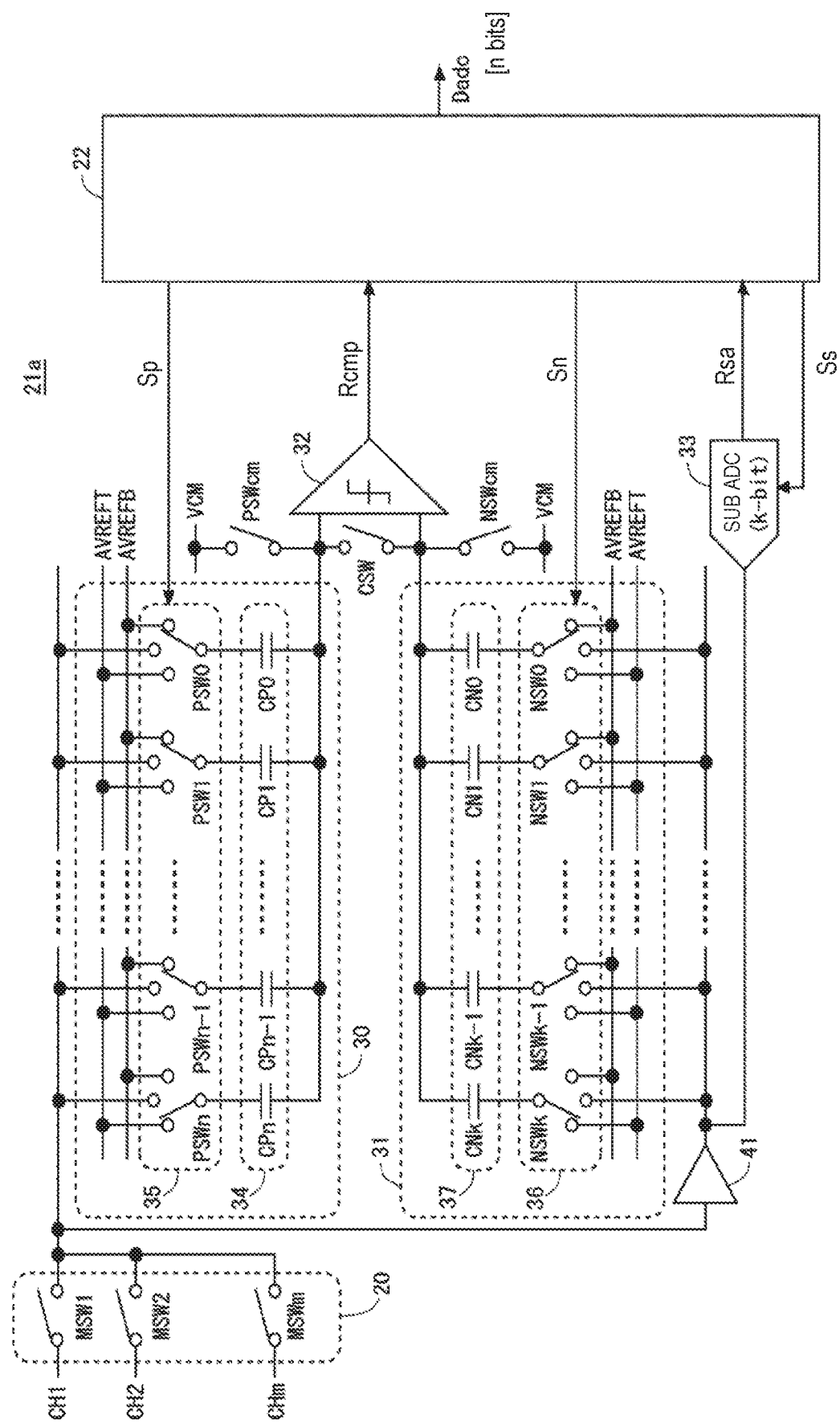
FIG. 12 is a circuit diagram illustrating a first embodiment of an analog-to-digital conversion circuit according to a second embodiment.

FIG. 12 is a circuit diagram illustrating a first embodiment of an analog-to-digital conversion circuit according to a second embodiment. In the first embodiment shown in FIG. 12, analog input signals are input to the NDAC31 and the sub ADC33 through the buffer 41.

In this manner, by providing the analog input signal to the NDAC31 and the analog input signal to the sub ADC33 via the buffer 41, the time required for the first sampling process in the first period and the sampling process of the sub ADC33 in the first period can be shortened.

Figure 13:
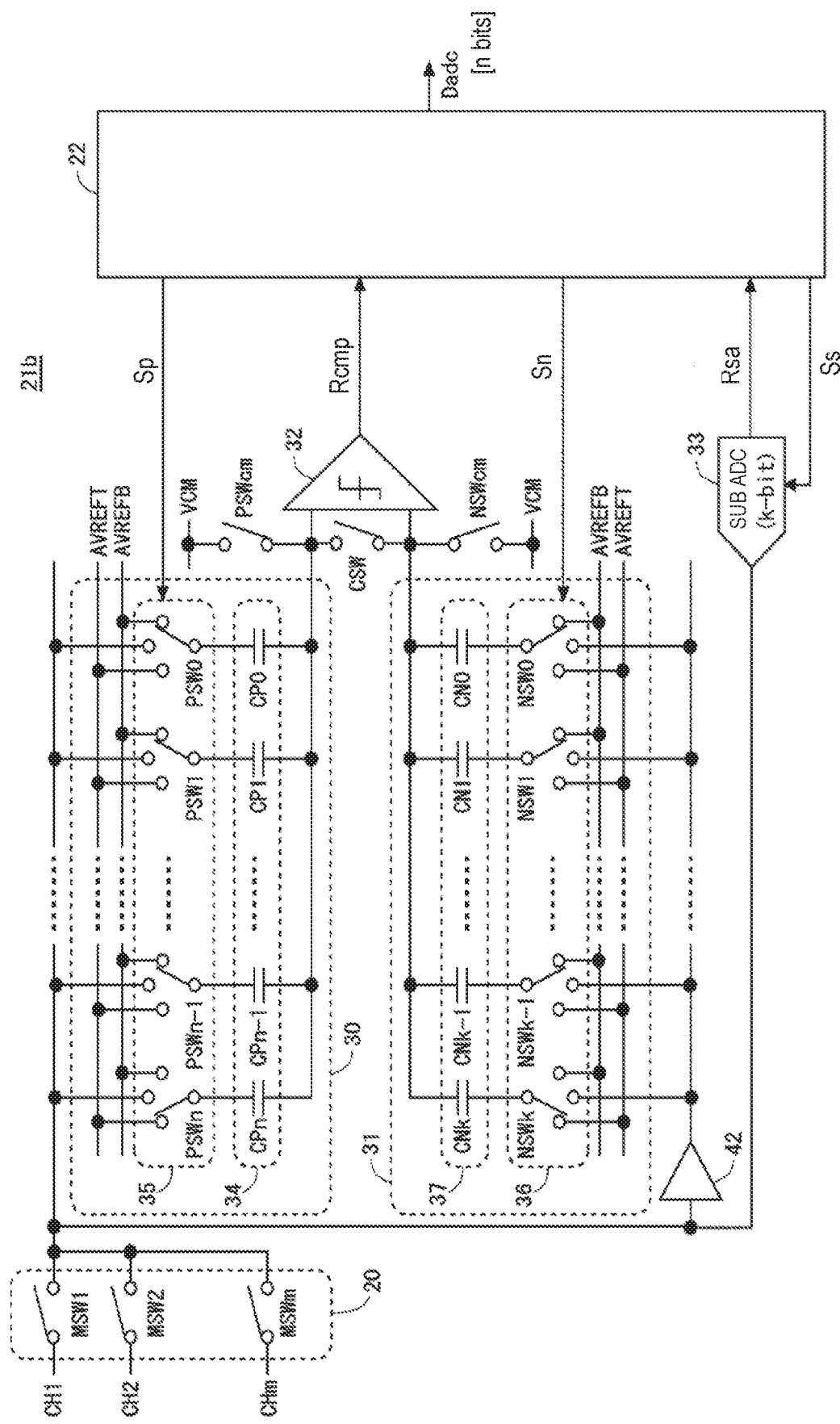
FIG. 13 is a circuit diagram illustrating a second exemplary analog-to-digital conversion circuit according to the second embodiment.

FIG. 13 is a circuit diagram illustrating a second exemplary analog-to-digital conversion circuit according to the second embodiment. In the second embodiment shown in FIG. 13, analog input signals are input to the NDAC31 through buffers 42.

In this manner, by providing the analog input signal to the NDAC31 via the buffer 42, the time required for the first sampling process in the first period can be shortened.

In addition, by applying analog input signals to at least one of the NDAC31 and the sub ADC33 through the buffer, the impedance seen from the input terminal of the analog-to-digital conversion circuit 16 can be substantially only the impedance related to the PDAC30. As a result, it is not necessary to lower the output impedance of the driver for providing the analog input signal to the analog-to-digital conversion circuit 16. Further, since the circuit connected to the subsequent stage of the buffer 41 or the buffer 42 is separated from the conversion processing when the successive comparison processing for the PDAC30 is performed, the noises caused by the buffers 41 and 42 do not affect the conversion result.

The Third Embodiment

In the third embodiment, an ADC core 21c as another form of the ADC core 21 according to the first embodiment will be described. In the description of the third embodiment, the constituent elements described in the first embodiment are denoted by the same reference numerals as those of the first embodiment, and the description thereof is omitted.

Figure 14:
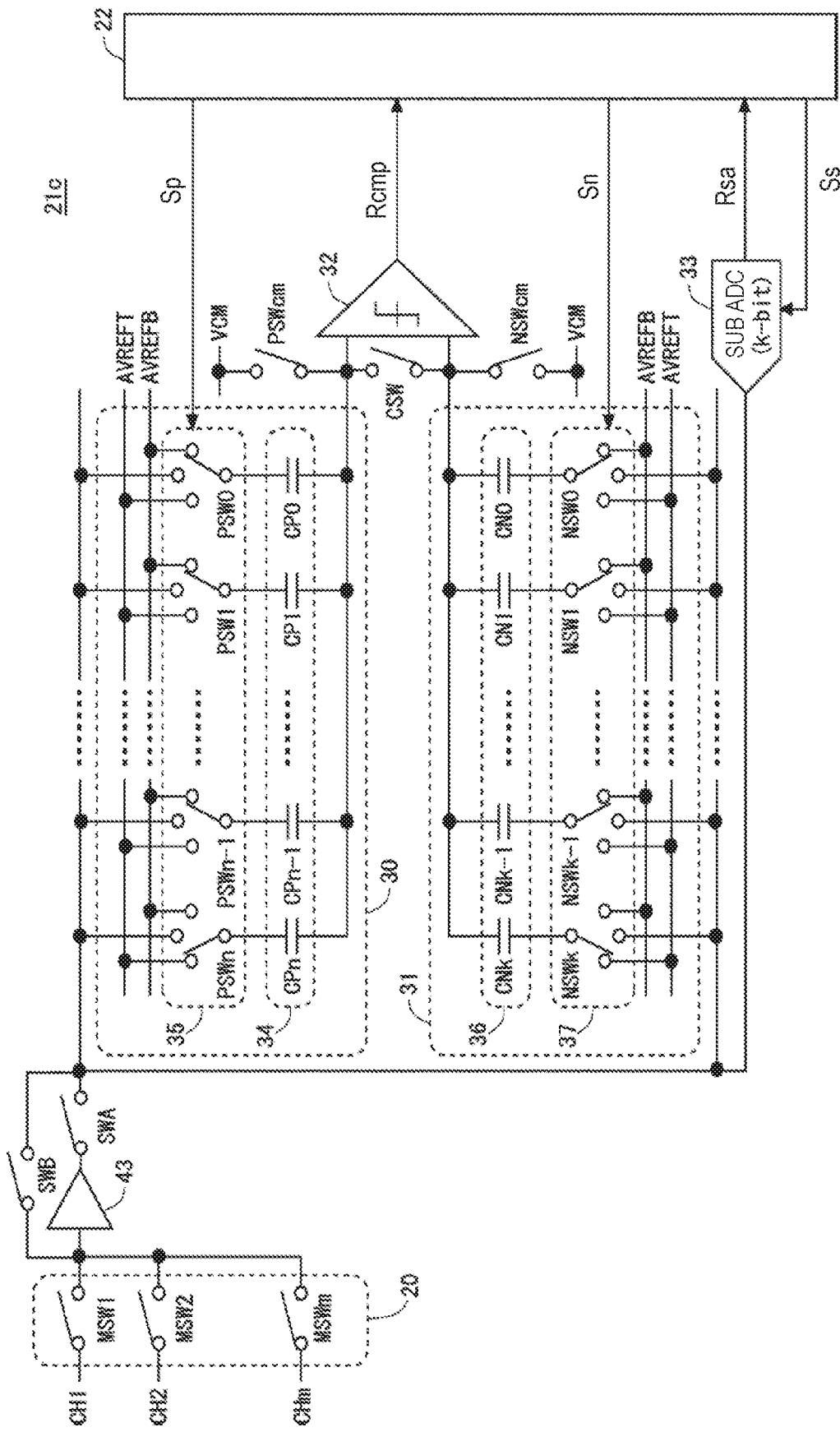
FIG. 14 is a circuit diagram of an analog-to-digital conversion circuit according to the third embodiment.

FIG. 14 is a circuit diagram of an analog-to-digital conversion circuit according to the third embodiment. As shown in FIG. 14, the ADC core 21c according to the third embodiment is obtained by adding buffer 43 and switches SWA and SWB to the ADC core 21 according to the first embodiment. The buffer 43 is provided after the multiplexers 20 and PDAC30, NDAC31 before the sub ADC33. The switch SWA is provided between the output terminal of the buffer 43 and the PDAC30, NDAC31 and sub ADC33. The switch SWB is provided so as to be connected in parallel to a series circuit of the buffer 43 and the switch SWA.

Figure 15:
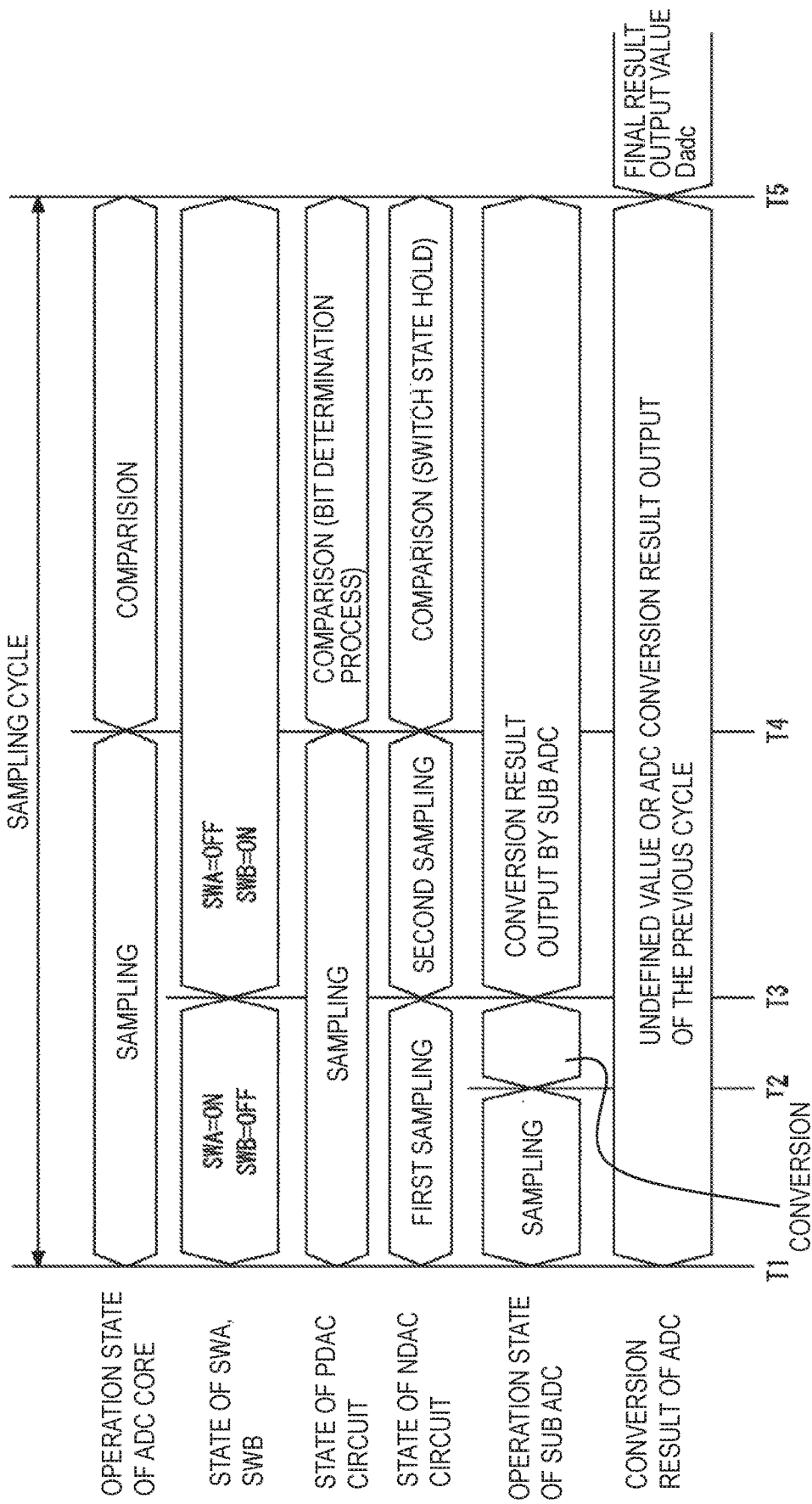
FIG. 15 is a timing chart for explaining the operation of the analog-to-digital conversion circuit according to the third embodiment.

The operation of the ADC core 21 according to the third embodiment will now be described. FIG. 15 is a timing chart for explaining the operation of the analog-to-digital conversion circuit according to the third embodiment. As shown in FIG. 15, in the ADC core 21 according to the third embodiment, the operation of the switches SWA and SWB is added to the operation of the ADC core 21 according to the first embodiment shown in FIG. 7. The switches SWA and SWB are controlled by the successive comparison ADC control circuit 22.

The switch SWA is controlled to be turned on in the first period of the timing T1 to T3. In the first period, the switch SWB is controlled to be turned off. On the other hand, in the second period and the third period, the switch SWA is controlled to be off and the switch SWB is controlled to be on.

In the ADC core 21c according to the third embodiment, the buffer 43 supplies the analog input voltage to both the PDAC30 and the NDAC31 to charge the capacitors of the PDAC30 and the NDAC31 during the first sampling process performed in the first period. At this time, only the input capacity of the buffer 43 is loaded from the signal source, and the input capacity of the buffer 43 is sufficiently smaller than the input capacities of the PDAC30 and the NDAC31.

On the other hand, in the second sampling process, since the switch SWA is controlled to be turned off, the buffer 43 is disconnected from the PDAC30 and the NDAC31. Instead of the buffer 43 being disconnected, the switch SWB is turned on to charge the analog input signal from the signal source to the PDAC30 of the switch SWB. At this time, since most of the charge amount to be charged is charged in the first period in which the first sampling process is performed, the signal source only needs to supply the offset of the buffer 43 and the voltage corresponding to the settling error. On the other hand, the capacitor on the NDAC31 side is separated from the terminal to which the analog input signal VIN is input, and is connected to one of the high potential side reference voltage AVREFT and the low potential side reference voltage AVREFB based on the control signal Sn generated based on the sub ADC converted result Rsa determined by the sub ADC33. Therefore, in the second sampling process, it is not necessary to supply the analog input signal from the signal source to the NDAC31. The ADC core 21c according to the third embodiment eliminates the disadvantage that the NDAC31 is connected to the input terminal of the ADC core 21c, and the sampling time can be made equal to the conventional sampling time even when the impedance of the analog signal source is high.

Although the invention made by the inventor has been specifically described based on the embodiment, the present invention is not limited to the embodiment already described, and it is needless to say that various modifications can be made without departing from the gist thereof.

What is claimed is:

1. An analog-to-digital conversion circuit comprising:
a main analog-to-digital conversion circuit for converting an analog input signal into a digital value;
a sub analog-to-digital conversion circuit for converting the analog input signal into a digital value; and
a successive comparison control circuit for controlling the main analog-to-digital conversion circuit and for outputting a final result output value,
wherein the main analog-to-digital conversion circuit includes:
a comparison circuit;
a first digital-to-analog conversion circuit having, a plurality of first capacitors having a one end coupled to one of differential input terminals of the comparison circuit, and a plurality of first switches selectively providing one of the analog input signal, a first reference voltage, and a second reference voltage to the other end of the plurality of first capacitors; and
a second digital-to-analog conversion circuit having, a plurality of second capacitors having a one end coupled to other of differential input terminals of the comparison circuit, and a plurality of second switches selectively providing one of the analog input signal, a first reference voltage, and a second reference voltage to the other end of the plurality of second capacitors,
wherein the successive comparison control circuit causes the plurality of first capacitors and the second capacitors to sample an analog value of the analog input signal in a first period, and obtains an intermediate digital value corresponding to an analog value of the analog input signal from the sub analog-to-digital conversion circuit,
wherein, in a second period after the end of the first period, the successive comparison control circuit provides one of the first reference voltage and the second reference voltage to other end of the plurality of capacitors by switching a connection state of the plurality of second switches to a state corresponding to the intermediate digital value,
wherein, in a third period after the end of the second period, a successive comparison operation of the plurality of first switches is performed to obtain the final result output value,
wherein the analog-to-digital conversion circuit further comprises:
a buffer circuit for transmitting the analog input signal to the first digital-to-analog conversion circuit, the second digital-to-analog conversion circuit, and the sub analog-to-digital conversion circuit;
a first switch provided between the first digital-to-analog conversion circuit, the second digital-to-analog conversion circuit and the sub analog-to-digital conversion circuit and an output terminal of the buffer circuit; and
a second switch coupled in parallel to a serial circuit formed by the buffer circuit and the first switch, and
wherein the successive comparison control circuit turns on the first switch and turns off the second switch in the first period, and turns off the first switch and turns on the second switch in the second period and the third period.

2. The analog-to-digital conversion circuit according to claim 1, further comprising a selection circuit for outputting one signal selected from a plurality of input signals having analog values as the analog input signal.

3. The analog-to-digital conversion circuit according to claim 2, wherein the selection circuit periodically switches the input signal output as the analog input signal.

4. The analog-to-digital conversion circuit according to claim 1, wherein the sub analog-to-digital conversion circuit is a flash type analog-to-digital conversion circuit.

5. The analog-to-digital conversion circuit according to claim 1, wherein the total capacitance of the plurality of second capacitors has the same capacitance as the total capacitance of the plurality of first capacitors.

6. The analog-to-digital conversion circuit according to claim 1, wherein the sub analog-to-digital conversion circuit has a resolution less than or equal to the resolution of the main analog-to-digital conversion circuit.

7. The analog-to-digital conversion circuit according to claim 6, wherein the successive comparison control circuit controls the plurality of second switches by a control signal generated by decoding the intermediate digital value output from the sub analog-to-digital conversion circuit.

8. A method of a signal conversion of an analog-to-digital conversion circuit, the analog-to-digital conversion circuit comprising:
a main analog-to-digital conversion circuit for converting an analog input signal into a digital value;
a sub analog-to-digital conversion circuit for converting the analog input signal into a digital value; and
a successive comparison control circuit for controlling the main analog-to-digital conversion circuit and for outputting a final result output value,
wherein the main analog-to-digital conversion circuit includes:
a comparison circuit;
a first digital-to-analog conversion circuit coupled to one of differential input terminals of the comparison circuit and having a charge redistribution type circuit configuration; and
a second digital-to-analog conversion circuit coupled to other of differential input terminals of the comparison circuit and having a charge redistribution type circuit configuration, and
wherein the analog-to-digital conversion circuit further comprises:
a buffer circuit for transmitting the analog input signal to the first digital-to-analog conversion circuit, the second digital-to-analog conversion circuit, and the sub analog-to-digital conversion circuit;
a first switch provided between the first digital-to-analog conversion circuit, the second digital-to-analog conversion circuit and the sub analog-to-digital conversion circuit and an output terminal of the buffer circuit; and
a second switch coupled in parallel to a serial circuit formed by the buffer circuit and the first switch, the method of the signal conversion of the analog-to-digital conversion circuit comprising:

sampling an analog value of the analog input signal by the first digital-to-analog conversion circuit and the second digital-to-analog conversion circuit in a first period, and obtaining an intermediate digital value corresponding to an analog value of the analog input signal from the sub analog-to-digital conversion circuit;

switching a reference voltage provided to the second digital-to-analog conversion circuit to a voltage value corresponding to the intermediate digital value of the analog signal in a second period after the end of the first period;

obtaining the final result output value by a successive comparison operation of a plurality of first switches of the first digital-to-analog conversion circuit in a third period after the end of the second period;

turning on the first switch of the analog-to-digital conversion circuit and tuning off the second switch of the analog-to-digital conversion circuit in the first period; and tuning off the first switch of the analog-to-digital conversion circuit and turning on the second switch of the analog-to-digital conversion circuit in the second period and the third period.

9. The method according to claim 8, further comprising selecting one signal from a plurality of input signals having an analog value as the analog input signal.

10. The method according to claim 9, further comprising periodically switching the input signal to be output as the analog input signal.

11. The method according to claim 8, wherein the total capacitance of a sampling capacitor in the second digital-to-analog conversion circuit has the same capacitance as the total capacitance of a sampling capacitor in the first digital-to-analog conversion circuit.

12. The method according to claim 8, wherein the sub analog-to-digital conversion circuit has a resolution less than or equal to the resolution of the main analog-to-digital conversion circuit.

13. The method according to claim 12, wherein a reference voltage to be provided to the second digital-to-analog conversion circuit is switched by a control signal generated by decoding the intermediate digital value output from the sub analog-to-digital conversion circuit.

* * * * *